(12) United States Patent
Yun et al.

(10) Patent No.: US 10,229,946 B2
(45) Date of Patent: Mar. 12, 2019

(54) IMAGE SENSOR INCLUDING COLOR SEPARATION ELEMENT

(71) Applicant: SAMSUNG ELECTRONICS CO., LTD., Suwon-si (KR)

(72) Inventors: Seokho Yun, Hwaseong-si (KR); Sookyoung Roh, Seoul (KR); Sunghyun Nam, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/287,097

(22) Filed: Oct. 6, 2016

(65) Prior Publication Data
US 2017/0098672 A1    Apr. 6, 2017

(30) Foreign Application Priority Data
Oct. 6, 2015    (KR) .................. 10-2015-0140610

(51) Int. Cl.
H01L 27/146    (2006.01)
H04N 9/04    (2006.01)
H04N 5/30    (2006.01)

(52) U.S. Cl.
CPC .. H01L 27/14621 (2013.01); H01L 27/14605 (2013.01); H04N 9/045 (2013.01); *H04N 5/30* (2013.01); *H04N 2209/045* (2013.01)

(58) Field of Classification Search
CPC ........ H01L 27/14621; H01L 27/14605; H04N 9/045; H04N 5/30; H04N 2209/045
See application file for complete search history.

(56) References Cited

U.S. PATENT DOCUMENTS 5,694,495 A    12/1997    Nara et al.
8,289,422 B2    10/2012    Hiramoto et al.
(Continued)

FOREIGN PATENT DOCUMENTS

EP    2963923 A1    1/2016
JP    8-292998 A    11/1996
(Continued)

OTHER PUBLICATIONS

Seiji Nishiwaki, et al., "Efficient colour splitters for high-pixel-density image sensors", Nature Photonics, vol. 7, Mar. 2013, pp. 240-246.
(Continued)

*Primary Examiner* — Yasser A Abdelaziez
(74) *Attorney, Agent, or Firm* — Sughrue Mion, PLLC

(57) ABSTRACT

An image sensor includes a pixel array including a first pixel row, in which a plurality of first pixels and a plurality of second pixels are alternately arranged, and a second pixel row, in which a plurality of second pixels and a plurality of third pixels are alternately arranged; first color separation elements configured to allow light having a second wavelength band, among incident light, to pass therethrough and travel in a downward direction, and to allow a mixture of light having a first wavelength band and light having a third wavelength band, among the incident light, to pass therethrough and travel in a lateral direction; and first color filters on at least a portion of the plurality of first pixels, the first color filters being configured to transmit only the light having the first wavelength band.

24 Claims, 15 Drawing Sheets

(56) References Cited

U.S. PATENT DOCUMENTS

| | | |
|---|---|---|
| 8,384,818 B2 | 2/2013 | Hiramoto et al. |
| 2011/0164156 A1 | 7/2011 | Hiramoto et al. |
| 2012/0182453 A1 | 7/2012 | Hiramoto et al. |
| 2012/0206637 A1 | 8/2012 | Hiramoto et al. |
| 2012/0212656 A1* | 8/2012 | Hiramoto .......... H01L 27/14621 348/294 |
| 2014/0168485 A1* | 6/2014 | Hiramoto .......... H01L 27/14621 348/272 |
| 2015/0042850 A1 | 2/2015 | Bilcu et al. |
| 2016/0006995 A1* | 1/2016 | Yun ..................... G02B 5/22 348/336 |

FOREIGN PATENT DOCUMENTS

| | | |
|---|---|---|
| JP | 5325117 B2 | 10/2013 |
| JP | 5590457 B2 | 9/2014 |

OTHER PUBLICATIONS

Communication dated Feb. 16, 2017, issued by the European Patent Office in counterpart European application No. 16192642.3.

* cited by examiner

IMAGE SENSOR INCLUDING COLOR SEPARATION ELEMENT

CROSS-REFERENCE TO RELATED APPLICATION

This application claims priority from Korean Patent Application No. 10-2015-0140610, filed on Oct. 6, 2015 in the Korean Intellectual Property Office, the disclosure of which is incorporated herein in its entirety by reference.

BACKGROUND

1. Field

Apparatuses consistent with exemplary embodiments relate to an image sensor including a color separation element, and more particularly, to an image sensor capable of improving the efficiency of using light by using a color separation element.

2. Description of the Related Art

In general, a color display device or a color image sensor displays an image of various colors or sense colors of incident light by using color filters. In the existing color display devices or color image sensors, a red, green and blue (RGB) color filter method is widely used. According to this method, a green filter, for example, is located on two pixels among four pixels and a blue filter and a red filter are respectively located on the other two pixels. In addition to the RGB color filter method, a cyan, yellow, green and magenta (CYGM) color filter may be employed. In this case, color filters corresponding to cyan, yellow, green, and magenta, which complement each other, are respectively located on four pixels.

However, the efficiency of using light may be low since each of color filters absorbs lights of colors except for a particular color allowed to transmit each color filter. For example, when an RGB color filter is used, only one-third of incident light is transmitted and the other two-thirds of the incident light are absorbed. Thus, the efficiency of using the incident light is only about 33%. Thus, a large amount of light is lost when a color filter is used in a color display device or a color image sensor.

Recently, in order to increase the efficiency of using light in a color display device or a color image sensor, various attempts have been made to use a color separation element instead of the color filter. The color separation element may separate the colors of incident light based on the diffraction or refraction characteristics of light which vary according to the wavelength thereof. The colors separated by the color separation element may be provided to pixels corresponding to the colors.

SUMMARY

One or more exemplary embodiments provide an image sensor capable of improving the efficiency of using light by using a color separation element.

Additional aspects will be set forth in part in the description which follows and, in part, will be apparent from the description, or may be learned by practice of the exemplary embodiments.

According to an aspect of an exemplary embodiment, there is provided an image sensor including: a pixel array including a first pixel row, in which a plurality of first pixels and a plurality of second pixels are alternately arranged, and a second pixel row, in which a plurality of second pixels and a plurality of third pixels are alternately arranged; first color separation elements arranged to face the plurality of second pixels arranged in the first pixel row and the plurality of second pixels arranged in the second pixel row, the first color separation elements being configured to allow light having a second wavelength band, among incident light, to pass therethrough and travel in a downward direction, and to allow a mixture of light having a first wavelength band and light having a third wavelength band, among the incident light, to pass therethrough and travel in a lateral direction; and first color filters on at least a portion of the plurality of first pixels, the first color filters being configured to transmit only the light having the first wavelength band.

The light having the second wavelength band may pass through the first color separation elements and may be incident on the plurality of second pixels arranged in the first pixel row and the plurality of second pixels arranged in the second pixel row, and in the first pixel row, the mixture of the light having the first wavelength band and the light having the third wavelength band may pass through the first color separation elements and may be incident on the first color filters, and in the second pixel row, the mixture of the light having the first wavelength band and the light having the third wavelength band may pass through the first color separation elements and may be incident on the plurality of third pixels.

The image sensor may obtain an intensity of at least one of the light having the first wavelength band, the light having the second wavelength band, and the light having the third wavelength band, based on the light having the first wavelength band and which is incident on the plurality of first pixels, the light having the second wavelength band and which is incident on the plurality of the second pixels arranged in the first pixel row and the plurality of second pixels arranged in the second pixel row, and the mixture of the light having the first wavelength band and the light having the third wavelength band, which is incident on the plurality of third pixels.

The image sensor may further include a second color filter on a second pixel, the second color filter being configured to transmit only the light having the second wavelength band.

The image sensor may further include third color filters on a first portion of the plurality of first pixels, third color filters being configured to transmit only the light having the third wavelength band, and the first color filters may be arranged on a second portion of the plurality of first pixels, and the first color filters and the third color filters may be alternately arranged on the plurality of first pixels.

The image sensor may obtain an intensity of at least one of the light having the first wavelength band, the light having the second wavelength band, and the light having the third wavelength band, based on the light having the first wavelength band which passes the first color filters and is incident on the second portion of the plurality of first pixels, the light having the third wavelength band which passes the third color filters and is incident on the first portion of the plurality of the first pixels, the light having the second wavelength band which is incident on the plurality of the second pixels arranged in the first pixel row and the plurality of second pixels arranged in the second pixel row, and the mixture of the light having the first wavelength band and the light having the third wavelength band, which is incident on the plurality of third pixels.

Adjacent first color separation elements may be positioned to have an angle of about 90 degrees with respect to each other.

The plurality of second pixels arranged in the first pixel row and the plurality of second pixels arranged in the second pixel row may be arranged in a first diagonal direction, and the plurality of first pixels in the first pixel row and the plurality of third pixels in the second pixel row may be arranged in a second diagonal direction crossing the first diagonal direction.

The first color separation elements may extend in at least one of the first diagonal direction and the second diagonal direction.

A first separation element among the first color separation elements may include a first sub-color separation element that extends in the first diagonal direction and a second sub-color separation element that extends in the second diagonal direction.

The image sensor may further include second color separation elements arranged to respectively face the plurality of first pixels and the plurality of third pixels and may allow the light having the second wavelength band, among the incident light, to pass therethrough and travel in the lateral direction, and may allow the mixture of the light having the first wavelength band and the light having the third wavelength band to pass therethrough and travel in the downward direction.

Adjacent first and second color separation elements may be positioned to have an angle of about 90 degrees with respect to each other.

The plurality of second pixels arranged in the first pixel row and the plurality of second pixels arranged in the second pixel row may be arranged in a first diagonal direction, the plurality of first pixels in the first pixel row and the plurality of third pixels in the second pixel row may be arranged in a second diagonal direction crossing the first diagonal direction, and the first and second color separation elements may respectively extend in at least one of the first diagonal direction and the second diagonal direction.

The plurality of second pixels arranged in the first pixel row and the plurality of second pixels arranged in the second pixel row may be arranged in a first diagonal direction, the plurality of first pixels and the plurality of third pixels may be arranged in a second diagonal direction crossing the first diagonal direction, and a first color separation element and a second color separation element may respectively include a first sub-color separation element that extends in the first diagonal direction and a second sub-color separation element that extends in the second diagonal direction.

The image sensor may further include a transparent dielectric layer on the pixel array, wherein the first color separation elements are positioned in the transparent dielectric layer, and the first color filter is between the pixel array and the transparent dielectric layer.

According to an aspect of an exemplary embodiment, there is provided an image sensor including: a pixel array including a first pixel row, in which a plurality of first pixels and a plurality of second pixels are alternately arranged, and a second pixel row, in which a plurality of second pixels and a plurality of third pixels are alternately arranged; color separation elements arranged to respectively face the plurality of first pixels and the plurality of third pixels, the color separation elements being configured to allow light having a second wavelength band, among incident light, to pass therethrough and travel in a lateral direction, and to allow a mixture of light having a first wavelength band and light having a third wavelength band, among the incident light, to pass therethrough and travel in a downward direction; and first color filters on at least a portion of the plurality of first pixels, the first color filters being configured to transmit only the light having the first wavelength band.

The light having the second wavelength band may pass through the color separation elements and may be incident on the plurality of second pixels arranged in the first pixel row and the plurality of second pixels arranged in the second pixel row, and in the first pixel row, the mixture of the light having the first wavelength band and the light having the third wavelength band may pass through the color separation elements and may be incident on the first color filters, and in the second pixel row, the mixture of the light having the first wavelength band and the light having the third wavelength band may pass through the color separation elements and may be incident on the plurality of third pixels.

The image sensor may obtain an intensity of at least one of the light having the first wavelength band, the light having the second wavelength band, and the light having the third wavelength band, based on the light having the first wavelength band and which is incident on the plurality of first pixels, the light having the second wavelength band and which is incident on the plurality of second pixels arranged in the first pixel row and the plurality of second pixels arranged in the second pixel row, and the mixture of the light having the first wavelength band and the light having the third wavelength band, which is incident on the plurality of third pixels.

The image sensor may further include third color filters on a first portion of the plurality of first pixels, the third color filters being configured to transmit only the light having the third wavelength band, and the first color filters may be arranged on a second portion of the plurality of first pixels, and the first color filters and the third color filters may be alternately disposed on the plurality of first pixels.

A color separation element may be positioned to have an angle of about 90 degrees with respect to another color separation element.

The plurality of second pixels arranged in the first pixel row and the plurality of second pixels arranged in the second pixel row may be arranged in a first diagonal direction, and the plurality of first pixels in the first pixel row and the plurality of third pixels in the second pixel row may be arranged in a second diagonal direction crossing the first diagonal direction.

The color separation elements may extend in at least one of the first diagonal direction and the second diagonal direction.

A color separation element among the color separation elements may include a first sub-color separation element that extends in the first diagonal direction and a second sub-color separation element that extends in the second diagonal direction.

The image sensor may further include a transparent dielectric layer located on the pixel array, wherein the color separation elements are positioned in the transparent dielectric layer, and wherein the first color filter is between the pixel array and the transparent dielectric layer.

According to an aspect of an exemplary embodiment, there is provided an image sensor, including: a pixel array including first pixels arranged in a first diagonal direction and second pixels arranged in a second diagonal direction crossing the first diagonal direction; color separation elements facing the first pixels and configured to allow first light, among an incident light, having a first wavelength band to pass therethrough and travel toward the first pixels, the color separation elements being configured to allow second light, among the incident light, having a second wavelength band to pass therethrough and travel toward the second pixels; and first color filters being configured to selectively transmit the first light or the second light according to a wavelength band, the first color filters being provided to only a first portion of the first pixels or provided to only a first portion of the second pixels.

The second wavelength band may include a third wavelength band and a fourth wavelength band, and the first color filters may be provided to only the first portion of the second pixels, and light having the third wavelength band may be incident on the first portion of the second pixels and the light having the fourth wavelength band may be incident on a second portion of the second pixels.

The first portion of the second pixels and the second portions of the second pixels may be alternately arranged in the second diagonal direction.

The first wavelength band may include a fifth wavelength band and a sixth wavelength band, and the first color filters may be provided to only the first portion of the first pixels, and light having the fifth wavelength band may be incident on the first portion of the first pixels and light having the sixth wavelength band may be incident on a second portion of the first pixels.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
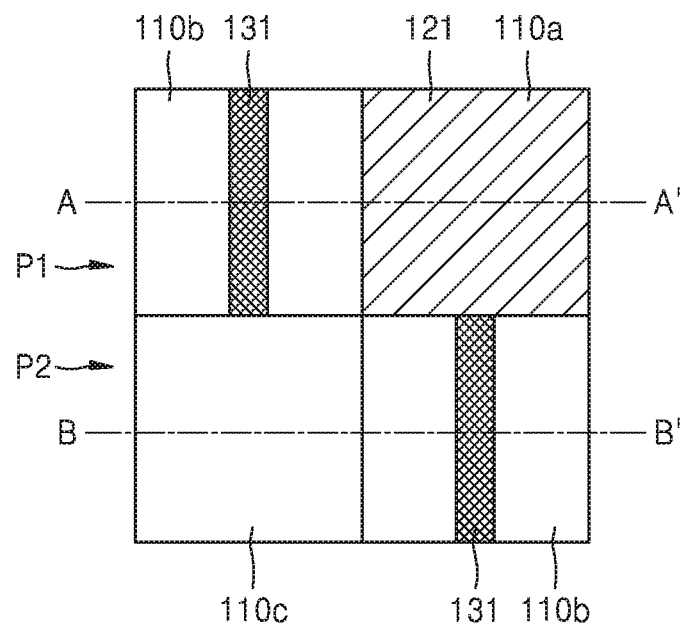
FIG. 1 is a schematic plan view of a structure of pixels of an image sensor according to an exemplary embodiment.

Reference will now be made in detail to image sensors including a color separation element according to exemplary embodiments, examples of which are illustrated in the accompanying drawings, wherein like reference numerals refer to like elements throughout. In the drawings, the sizes of various elements may be exaggerated for clarity and convenience of explanation. In this regard, the exemplary embodiments may have different forms and should not be construed as being limited to the descriptions set forth herein. In relation to the structures of layers which will be described below, it will be understood that when an element or layer is referred to as being 'on' another element or layer, the element or layer can be directly on another element or layer or intervening elements or layers.

FIG. 1 is a schematic plan view of a structure of pixels of an image sensor according to an exemplary embodiment, in which a unit of a pixel array of the image sensor has a 2×2 pattern.

Referring to FIG. 1, the image sensor may include a pixel array, including a first pixel 110a and a third pixel 110c arranged in a first diagonal direction, and two second pixels 110b arranged in a second diagonal direction crossing (or intersecting) the first diagonal direction. Although FIG. 1 illustrates one unit having a 2×2 pattern of the pixel array for convenience of explanation, the image sensor may include a pixel array including a plurality of units each having a 2×2 pattern which are arranged in a two dimensional manner (or in columns and rows). For example, the image sensor may include a first pixel row P1 in which a plurality of second pixels 110b and a plurality of first pixels 110a are alternately arranged in a horizontal direction (or row direction), and a second pixel row P2 in which a plurality of third pixels 110c and a plurality of second pixels 110b are alternately arranged in the horizontal direction. The plurality of first pixel rows P1 and the plurality of second pixel rows P2 may be alternately arranged in a vertical direction (or column direction).

The image sensor may further include first color separation elements 131 arranged to face the second pixels 110b included in the first and second pixel rows P1 and P2. The first color separation elements 131 divide incident light according to wavelengths of the incident light and allow divided lights corresponding to different wavelengths to travel in different paths. The first color separation elements 131 may separate colors of the incident light by changing a progress direction of the incident light, after passing through the first color separation elements 131, according to the wavelengths of the incident light. In particular, the diffraction or refraction characteristics of the incident light vary according to the wavelengths of the incident light.

Various shapes (for example, a transparent symmetrical or asymmetrical bar shape, a prism shape with an inclined surface, etc.) have been known as examples of the shapes of the first color separation elements 131. The shapes of the first color separation elements 131 may be variously designed according to a desired distribution of the spectrum of light to be emitted.

Figure 2:
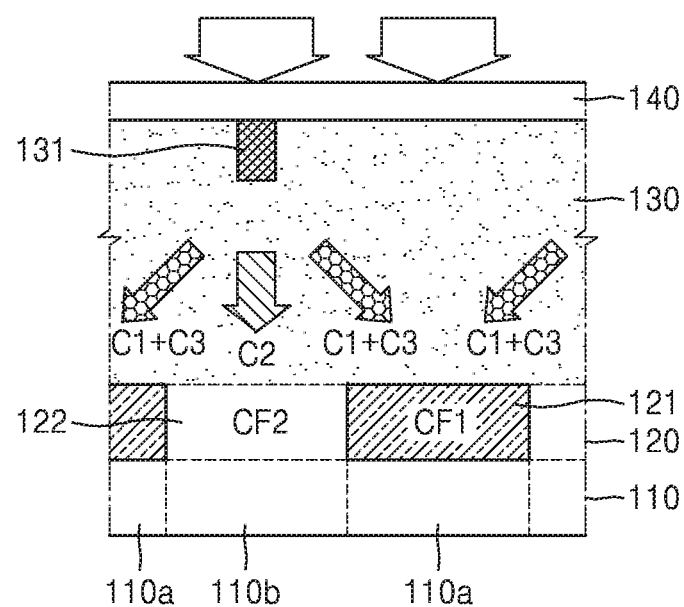
FIG. 2 is a cross-sectional view of a first pixel row of the image sensor of FIG. 1, taken along line A-A'.

FIG. 2 is a partially expanded cross-sectional view of the first pixel row P1 of the image sensor of FIG. 1, taken along line A-A'.

Referring to FIG. 2, the first pixel row P1 of the image sensor may include a light-sensing layer 110 that converts the intensity of incident light into an electrical signal, a color filter layer 120 located on the light-sensing layer 110 to transmit light of a desired wavelength band, a transparent dielectric layer 130 located on the color filter layer 120, a first color separation element 131 positioned in the transparent dielectric layer 130, and a micro-lens 140 located on the transparent dielectric layer 130. For example, the first color separation element 131 may be embedded and fixed in the transparent dielectric layer 130. In the light-sensing layer 110 included in the first pixel row P1, a plurality of second pixels 110b and a plurality of first pixels 110a may be alternately arranged. The color filter layer 120 may include a first color filter CF1 121 located on each of the plurality of first pixels 110a to transmit only light C1 having a first wavelength band. The color filter layer 120 may additionally include a second color filter CF2 122 located on each of the plurality of second pixels 110b to transmit only light C2 of a second wavelength band depending on an embodiment. Alternatively, the second color filter CF2 122 may be omitted.

The light-sensing layer 110 may be embodied as a semiconductor integrated circuit configured to sense the amount of incident light. The light-sensing layer 110 may be divided into a plurality of cells corresponding to the first and second pixels 110a and 110b on which the light-sensing layer 110 is located. The micro-lens 140 may be configured to collect light such that incident light is focused on the first color separation element 131. When the micro-lens 140 is used, the efficiency of separating colors by the first separation element 131 may be further increased. However, the micro-lens 140 is optional, and may be omitted depending on an embodiment.

To sufficiently diffract and refract incident light, the first color separation element 131 may include a material having a higher refractive index which is higher than those of materials surrounding the first color separation element 13. For example, the refractive index of the first color separation element 131 may be higher than that of the transparent dielectric layer 130 surrounding the first color separation element 131. For example, the transparent dielectric layer 130 may include $SiO_2$ or siloxane-based spin-on-glass (SOG), and the first color separation element 131 may include a material having a high refractive index, such as $TiO_2$, $SiN_3$, ZnS, ZnSe, $Si_3N_4$, etc. A shape and a material of the first color separation element 131 may be variously selected according to desired color separation characteristics thereof.

As illustrated in FIG. 2, the first color separation element 131 may be located to face the plurality of second pixels 110b. For example, the first color separation element 131 may be configured to allow light C2 having a second wavelength band of incident light to travel in a downward direction with respect to the first color separation element 131 and to allow light C1+C3, which is a mixture of lights having a first wavelength band and a third wavelength band of the incident light, to travel at an inclined angle (or in a lateral direction) toward both sides of the first color separation element 131. In this case, the light C2 having the second wavelength band and separated by the first color separation element 131 may travel toward the second pixels 110b below (or directly below) the first color separation element 131. The light C1+C3, which is the mixture of the lights having the first and third wavelength bands and is separated by the first color separation element 131, may travel toward the first pixels 110a at both sides of the second pixels 110b.

Thus, since only the light C2 having the second wavelength band is incident on the second pixels 110b, the amount of the light C2 having the second wavelength band of the incident light may be determined by measuring the amount of light incident on the second pixels 110b using the light-sensing layer 110. The second color filter CF2 122 that transmits only the light C2 of the second wavelength band may be arranged on the second pixels 110b to further improve color purity. However, this is merely exemplary and the second color filter CF2 122 may be omitted depending on an embodiment.

The light C1+C3, which is the mixture of the lights having the first and third wavelength bands and separated by the first color separation element 131, is incident on the first color filter CF1 121 located on the first pixels 110a. The first color filter CF1 121 blocks the light C3 having the third wavelength band and transmits only the light C1 having the first wavelength band and thus only the light C1 having the first wavelength band may be incident on the first pixels 110a. Thus, the amount of the light C1 having the first wavelength band of the incident light may be determined by measuring the amount of light incident on the first pixels 110a using the light-sensing layer 110.

Figure 3:
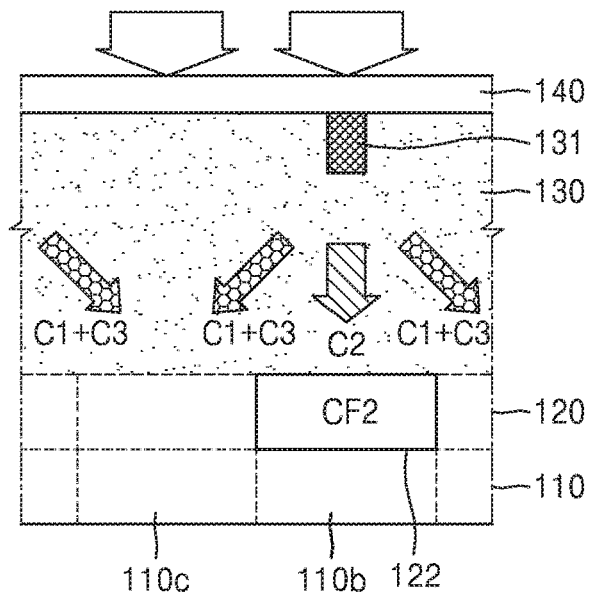
FIG. 3 is a cross-sectional view of a second pixel row of the image sensor of FIG. 1, taken along line B-B'.

FIG. 3 is a partially expanded cross-sectional view of the second pixel row P2 of the image sensor of FIG. 1, taken along line B-B'.

Referring to FIG. 3, the second pixel row P2 of the image sensor may include a light-sensing layer 110 that converts the intensity of incident light into an electrical signal, a color filter layer 120 located on the light-sensing layer 110 to transmit only light of a desired wavelength band, a transparent dielectric layer 130 located on the color filter layer 120, a first color separation element 131 positioned in the transparent dielectric layer 130, and a micro-lens 140 located on the transparent dielectric layer 130. For example, the first color separation element 131 may be embedded and fixed in the transparent dielectric layer 130. In the light-sensing layer 110 in the second pixel row P2, a plurality of third pixels 110c and a plurality of second pixels 110b may be alternately arranged. The color filter layer 120 of FIG. 3 is substantially the same as the color filter layer 120 of FIG. 2 except that a color filter may not be located on the color filter layer 120 corresponding to the third pixels 110c in the second pixel row P2. A second color filter 122 that transmits only light C2 of a second wavelength band may be located on each of the second pixels 110b depending on an embodiment, or may be omitted. On the other hand, a color filter may not be located on the third pixels 110c.

As illustrated in FIG. 3, in the second pixel row P2, the first color separation element 131 may be also arranged to face the second pixels 110b. As described above, the first color separation element 131 may be configured to allow the light C2 of the second wavelength band of incident light to travel in a downward direction with respect to the first color separation element 131 and allow light C1+C3 which is a mixture of lights having a first wavelength band and a third wavelength band of the incident light to travel at an inclined angle (or in a lateral direction) toward both sides of the first color separation element 131. In this case, the light C2 having the second wavelength band and separated by the first color separation element 131 may travel toward the second pixels 110b below the first color separation element 131. The light C1+C3, which is the mixture of lights having the first and third wavelength bands and is separated by the first color separation element 131, may travel toward the third pixels 110c at both sides of the second pixels 110b.

Thus, since only the light C2 having the second wavelength band is incident on the second pixels 110b, the amount of the light C2 having the second wavelength band may be determined by measuring the amount of light incident on the second pixels 110b using the light-sensing layer 110. The second color filter 122 that transmits only the light C2 having the second wavelength band may be arranged on the second pixels 110b to further improve color purity. However, this is merely exemplary and the second color filter 122 may be omitted depending on an embodiment. The light C1+C3, which is the mixture of lights having the first and third wavelength bands and is separated by the first color separation element 131, may be directly incident on the third pixels 110c without passing through any color filter. Thus, the sum of the amount of the light C1 having the first wavelength band and the amount of the light C3 having the third wavelength band may be determined by measuring the amount of light incident on the third pixels 110c by using the light-sensing layer 110.

For example, the light C1 having the first wavelength band may be red light, the light C2 of the second wavelength band may be green light, and the light C3 having the third wavelength band may be blue light. In this case, the light C1+C3 which is the mixture of the lights having the first and third wavelength bands may be magenta light. Alternatively, the light C1 having the first wavelength band may be blue light, the light C2 of the second wavelength band may be green light, and the light C3 having the third wavelength band may be red light.

Figure 4:
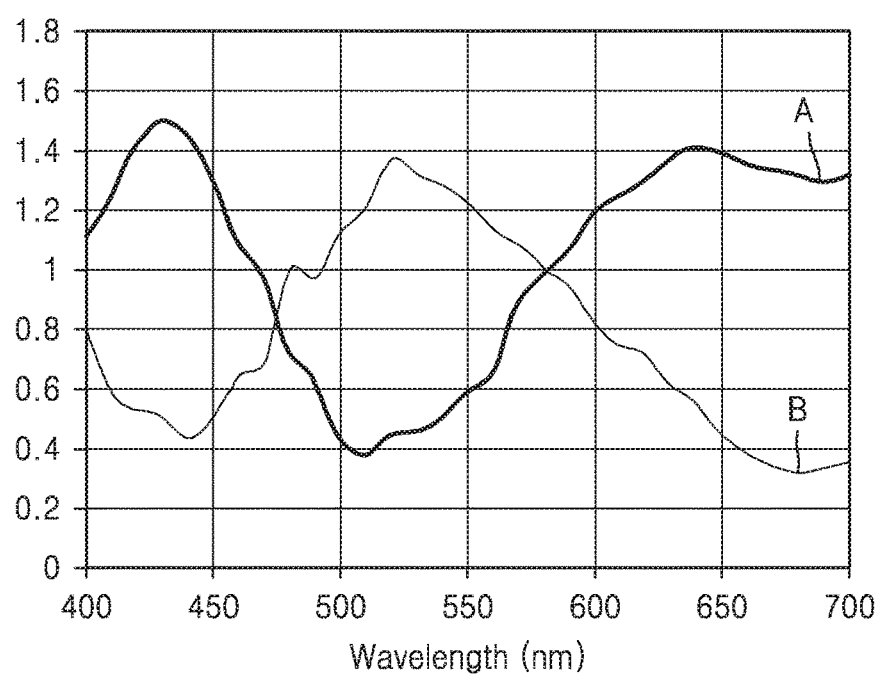
FIG. 4 is a graph showing a distribution of a spectrum of light separated by a color separation element of FIG. 1.

FIG. 4 is a graph showing a distribution of the spectrum of light separated by the first color separation element 131. In FIG. 4, a horizontal axis denotes a wavelength (nm) and a vertical axis denotes a normalized light-intensity. In FIG. 4, a graph denoted by 'A' shows the spectrum of the light C1+C3 which is the mixture of lights having the first and third wavelength bands and which travels at an inclined angle toward both sides of the first color separation element 131. A graph denoted by 'B' shows the spectrum of the light C2 of the second wavelength band traveling in a downward direction with respect to the first color separation element 131. It is assumed in FIG. 4 that white light is incident on the first color separation element 131. However, an actual distribution of the spectrum of light separated by the first color separation element 131 may vary according to the characteristics of the incident light. Also, it is assumed in FIG. 4 that the light C1 having the first wavelength band may be red light, the light C2 of the second wavelength band may be green light, and the light C3 having the third wavelength band may be blue light.

Light having a distribution of spectrum as shown in the graph B of FIG. 4 may be incident on the second pixels 110b arranged in the first pixel row P1 and the second pixel row P2. That is, since green light is incident on the second pixels 110b, the amount of the green light of the incident light may be sensed in the second pixels 110b. Light having a distribution of spectrum as shown in the graph A of FIG. 4 may be incident on the first pixels 110a arranged in the first pixel row P1 and the third pixels 110c arranged in the second pixel row P2. That is, magenta light may be incident on the first and third pixels 110a and 110c. However, since the first color filter 121 that transmits only red light is located on the first pixels 110a arranged in the first pixel row P1, the amount of red light of the incident light may be sensed in the first pixels 110a. On the other hand, since a color filter is not located on the third pixels 110c arranged in the second pixel row P2, the amounts of red light and blue light of the incident light may be sensed in the third pixels 110c.

Thus, an image signal processor (not shown) of the image sensor may be precisely obtain (or calculate) red, green, and blue light components of the incident light, based on the amount of the red light sensed in the first pixels 110a, the amount of the green light sensed in the second pixels 110b, and the amount of the magenta light sensed in the third pixels 110c. In particular, information regarding the red light and information regarding the blue light may be obtained from in the third pixels 110c and thus information regarding the red, green, and blue light components of the incident light may be precisely extracted. Thus, the image sensor according to an exemplary embodiment may achieve high color purity. Also, since the colors of incident light are separated using the first color separation element 131 and only one color filter is used, an optical loss may be reduced and the efficiency of using light may be improved. Thus, the image sensor according to an exemplary embodiment may achieve high sensitivity and high color purity.

Figure 5:
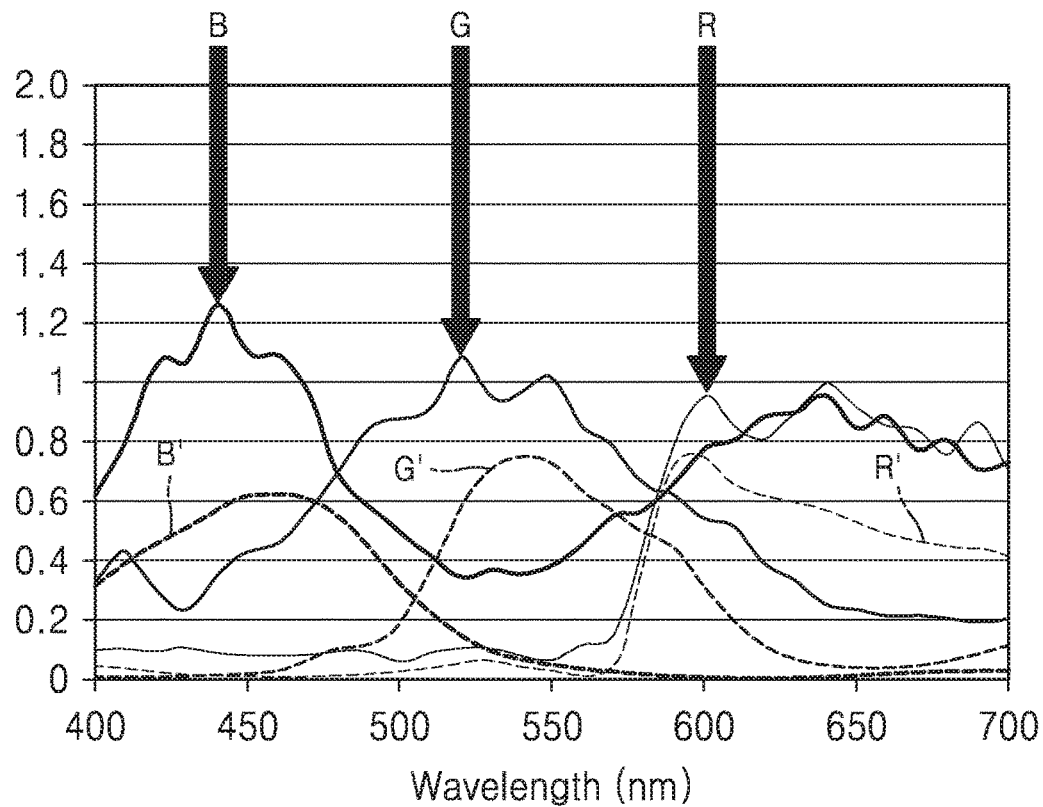
FIG. 5 is a graph showing a distribution of a spectrum of incident light calculated based on information regarding a quantity of light obtained from each of the pixels of the image sensor of FIG. 1.

FIG. 5 is a graph showing a distribution of the spectrum of incident light calculated based on information regarding the quantity of light obtained from each of the pixels of the image sensor of FIG. 1.

Here, it is assumed that the incident light is white light. In FIG. 5, a solid-line graph denoted by 'R' shows a distribution of the spectrum of red light, a solid-line graph denoted by 'G' shows a distribution of the spectrum of green light, and a solid-line graph denoted by 'B' shows a distribution of the spectrum of blue light. For comparison, FIG. 5 also illustrates a distribution of the spectrum of incident light, obtained by a related art image sensor that uses a color filter. For example, in FIG. 5, a dotted-line graph denoted by 'R' shows a distribution of the spectrum of red light obtained by the related art image sensor, a dotted-line graph denoted by 'G' shows a distribution of the spectrum of green light obtained by the related art image sensor, and a dotted-line graph denoted by 'B' shows a distribution of the spectrum of blue light obtained by the related art image sensor.

As illustrated in FIG. 5, in the image sensor according to an exemplary embodiment, an optical loss is substantially prevented and thus higher sensitivity may be achieved than when the related art image sensor is used.

Figure 6:
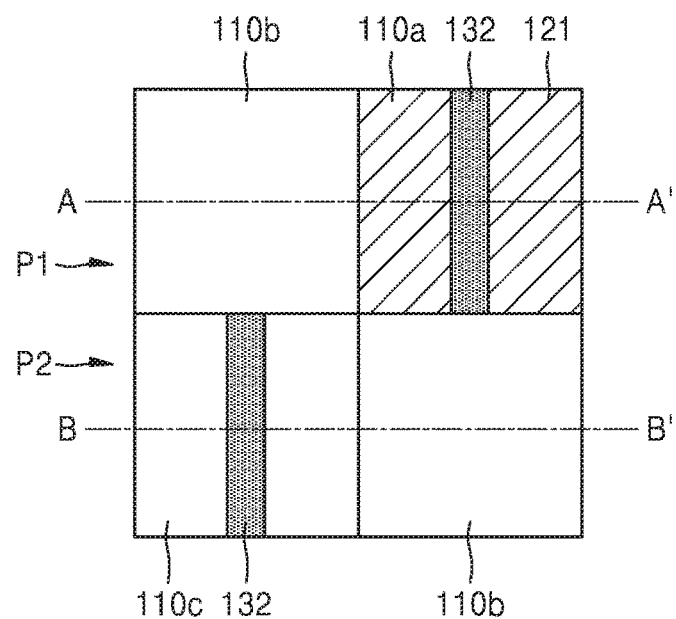
FIG. 6 is a schematic plan view of a structure of pixels of an image sensor according to another exemplary embodiment.

FIG. 6 is a schematic plan view of a structure of pixels of an image sensor according to another exemplary embodiment.

Referring to FIG. 6, the image sensor may include a first pixel row P1 in which a plurality of second pixels 110b and a plurality of first pixels 110a are alternately arranged in a horizontal direction (or row direction), and a second pixel row P2 in which a plurality of third pixels 110c and a plurality of second pixels 110b are alternately arranged in the horizontal direction. The plurality of first pixel rows P1 and the plurality of second pixel rows P2 may be alternately arranged in a vertical direction (or column direction).

The plurality of first pixels 110a and the plurality of third pixel 110c may be arranged in a first diagonal direction. Two second pixels 110b respectively arranged in the first and second pixel rows P1 and P2 may be arranged in a second diagonal direction intersecting the first diagonal direction. Thus, the first and third pixels 110a and 110c and the two second pixels 110b arranged in the first and second pixel rows P1 and P2 may together form a 2×2 pattern of one unit, and a pixel array of the image sensor may include a plurality of 2×2 patterns that are two-dimensionally arranged. Also, the image sensor may include second color separation elements 132 arranged to respectively face the first and third pixels 110a and 110c.

Figure 7:
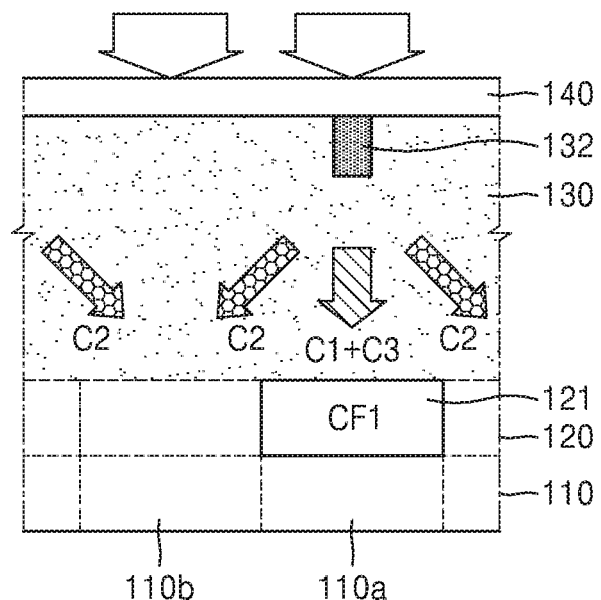
FIG. 7 is a cross-sectional view of a first pixel row of the image sensor of FIG. 6, taken along line A-A'.

FIG. 7 is a partially expanded cross-sectional view of the first pixel row P1 of the image sensor of FIG. 6, taken along line A-A'.

Referring to FIG. 7, the first pixel row P1 of the image sensor may include a light-sensing layer 110 that converts the intensity of incident light into an electrical signal, a color filter layer 120 located on the light-sensing layer 110 to transmit only light having a desired wavelength band, a transparent dielectric layer 130 located on the color filter layer 120, a second color separation element 132 positioned in the transparent dielectric layer 130, and a micro-lens 140 located on the transparent dielectric layer 130. The second color separation element 132 may be embedded and fixed in the transparent dielectric layer 130.

The color filter layer 120 may include a first color filter 121 located on the first pixel 110a to transmit only light C1 having a first wavelength band. The color filter layer 120 may additionally include a second color filter 122 located on the second pixel 110b that transmits only light C2 having a second wavelength band depending on an embodiment, or the second color filter 122 may be omitted.

As illustrated in FIG. 7, the second color separation element 132 may be arranged to face the first pixel 110a. For example, the second color separation element 132 may be configured to allow the light C2 having the second wavelength band of the incident light to travel at an inclined angle toward both sides of the second color separation element 132 and allow light C1+C3, which is a mixture of lights having a first wavelength band and a third wavelength band, to travel in a downward direction with respect to the second color separation element 132. In this case, the light C1+C3, which is the mixture of lights having the first and third wavelength bands and is separated by second color separation element 132, may travel toward the first pixel 110a below the second color separation element 132. The light C2 having the second wavelength band separated by second color separation element 132 may travel toward the second pixels 110b at both sides of the first pixel 110a.

The light C1+C3, which is the mixture of lights having the first and third wavelength bands and is separated by the second color separation element 132, is incident on the first color filter 121 located on the first pixel 110a. The first color filter 121 blocks the light C3 having the third wavelength band and transmits only the light C1 having the first wavelength band. Thus, only the light C1 having the first wavelength band may be incident on the first pixel 110a. Thus, the amount of the light C1 having the first wavelength band included in the incident light may be determined by measuring the amount of light incident on the first pixel 110a by using the light-sensing layer 110. Since only the light C2 of the second wavelength band is incident on the second pixel 110b, the amount of the light C2 of the second wavelength band of the incident light may be determined by measuring the amount of light incident on the second pixel 110b using the light-sensing layer 110. The second color filter 122 that transmits only the light C2 having the second wavelength band may be arranged on the second pixel 110b to improve color purity, depending on an embodiment.

Figure 8:
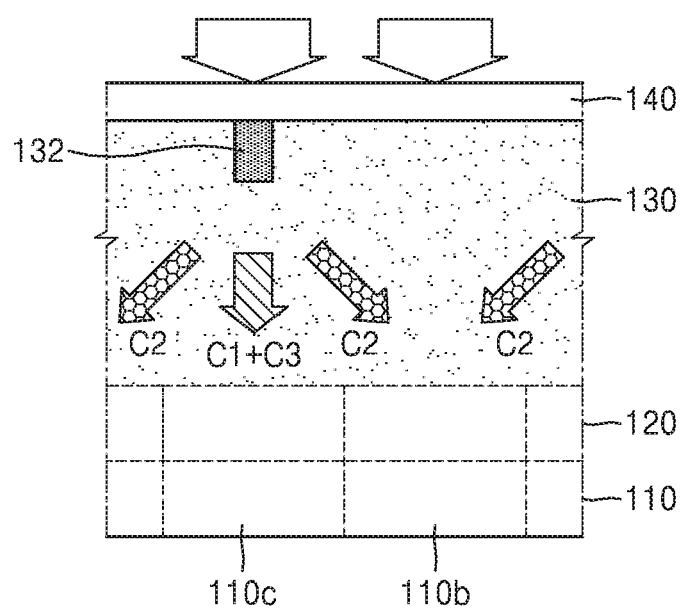
FIG. 8 is a cross-sectional view of a second pixel row of the image sensor of FIG. 6, taken along line B-B'.

FIG. 8 is a partially expanded cross-sectional view of the second pixel row P2 of the image sensor of FIG. 6, taken along line B-B'.

Referring to FIG. 8, the second pixel row P2 of the image sensor may include a light-sensing layer 110 that converts the intensity of incident light into an electrical signal, a color filter layer 120 located on the light-sensing layer 110 to transmit only light having a desired wavelength band, a transparent dielectric layer 130 located on the color filter layer 120, a second color separation element 132 positioned in the transparent dielectric layer 130, and a micro-lens 140 located on the transparent dielectric layer 130. For example, the second color separation element 132 may be embedded and fixed in the transparent dielectric layer 130.

The color filter layer 120 of FIG. 8 is substantially the same as the color filter layer 120 of FIG. 7 except that a color filter may not be located on the color filter layer 120 corresponding to the third pixel 110c in the second pixel row P2. The second color filter 122 that transmits only light C2 having a second wavelength band may be located on the second pixel 110b depending on an embodiment, or may be omitted. On the other hand, a color filter may not be located on the third pixel 110c.

As illustrated in FIG. 8, the second color separation element 132 may be arranged in the second pixel row P2 to face the third pixel 110c. As described above, the second color separation element 132 may be configured to allow the light C2 having the second wavelength band of the incident light to travel at an inclined angle (or in a lateral direction) toward both sides of the second color separation element 132 and allow light C1+C3, which is a mixture of lights having a first wavelength band and a third wavelength band, to travel below the second color separation element 132. Then, the light C1+C3, which is the mixture of the lights having the first and third wavelength bands and is separated by the second color separation element 132, may travel toward the third pixel 110c in a downward direction with respect to the second color separation element 132, and the light C2 of the second wavelength band separated by the second color separation element 132 may travel toward the second pixels 110b at both sides of the third pixel 110c.

Thus, since only the light C2 having the second wavelength band is incident on the second pixel 110b, the amount of the light C2 of the second wavelength band of the incident light may be determined by measuring the amount of light incident on the second pixel 110b by using the light-sensing layer 110. The second color filter 122 that transmits only the light C2 of the second wavelength band may be arranged on the second pixel 110b to improve color purity, or may be omitted depending on an embodiment. The light C1+C3, which is the mixture of the lights having the first and third wavelength bands and is separated by the second color separation element 132, may be directly incident on the third pixels 110c without passing through any color filter. Thus, the sum of the amount of the light C1 having the first wavelength band and the amount of the light C3 having the third wavelength band of the incident light may be determined by measuring the amount of light incident on the third pixels 110c by using the light-sensing layer 110.

For example, the light C1 having the first wavelength band may be red light, the light C2 having the second wavelength band may be green light, and the light C3 having the third wavelength band may be blue light. Thus, the light C1+C3 which is the mixture of the lights having the first and third wavelength bands may be magenta light. Alternatively, the light C1 having the first wavelength band may be blue light, the light C2 of the second wavelength band may be green light, and the light C3 having the third wavelength band may be red light.

Figure 9:
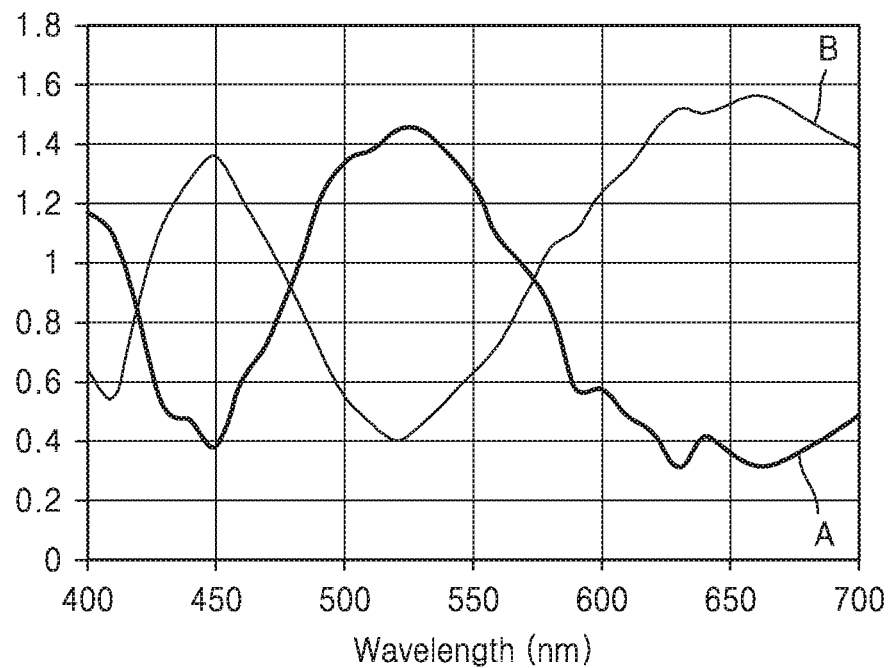
FIG. 9 is a graph showing a distribution of a spectrum of light separated by a color separation element of FIG. 6.

FIG. 9 is a graph showing a distribution of the spectrum of light separated by the second color separation element 132.

In FIG. 9, a graph denoted by 'A' shows the spectrum of the light C2 having the second wavelength band which travels at an inclined angle toward both sides of the second color separation element 132, and a graph denoted by 'B' shows the spectrum of the light C1+C3 having the first and third wavelength bands traveling in a downward direction with respect to the second color separation element 132. In FIG. 9, it is assumed that white light is incident on the second color separation element 132. However, an actual distribution of the spectrum of light separated by the second color separation element 132 may vary according to the characteristics of the incident light. Also, it is assumed in FIG. 9 that the light C1 having the first wavelength band may be red light, the light C2 of the second wavelength band may be green light, and the light C3 having the third wavelength band may be blue light.

In an exemplary embodiment, light having a distribution of spectrum as shown in the graph A of FIG. 9 may be incident on the second pixels 110b arranged in the first pixel row P1 and the second pixel row P2. That is, green light is incident on the second pixels 110b and thus the amount of the green light of the incident light may be sensed in the second pixels 110b. Light having a distribution of spectrum as shown in the graph B of FIG. 9 may be incident on the first pixel 110a arranged in the first pixel row P1 and the third pixel 110c arranged in the second pixel row P. That is, magenta light may be incident on the first and third pixels 110a and 110c.

Since the first color filter 121 that transmits only red light is arranged on the first pixel 110a, which is arranged in the first pixel row P1, the amount of the red light of the incident light may be sensed in the first pixel 110a. On the other hand, a color filter is not located on the third pixel 110c arranged in the second pixel row P2, and the amount of the red light and the amount of the blue light of the incident light may be sensed in the third pixel 110c. Thus, an image signal processor (not shown) of the image sensor may precisely calculate the red, green, and blue light components of the incident light, based on the amount of the red light sensed in the first pixel 110a, the amount of the green light sensed in the second pixel 110b, and the amount of the magenta light sensed in the third pixel 110c.

Figure 10:
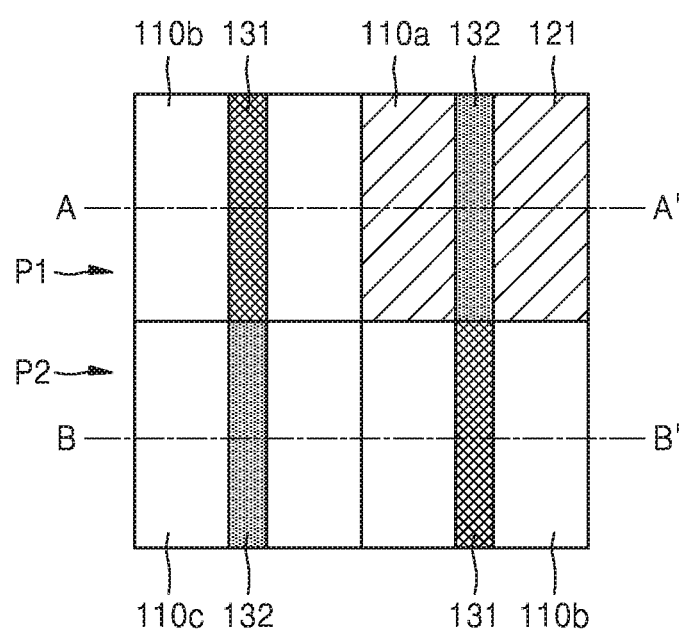
FIG. 10 is a schematic plan view of a structure of pixels of an image sensor according to still another exemplary embodiment.

FIG. 10 is a schematic plan view of a structure of pixels of an image sensor according to still another exemplary embodiment.

The image sensor of FIG. 10 may include a pixel array as described above with reference to FIGS. 1 and 6. For example, the pixel array of the image sensor may include a plurality of 2×2 patterns each including a first pixel 110a and a third pixel 110c arranged in a first diagonal direction and two second pixels 110b arranged in a second diagonal direction intersecting the first diagonal direction.

The image sensor of FIG. 10 may further include first color separation elements 131 arranged to face the second pixels 110b in first and second pixel rows P1 and P2, and second color separation elements 132 arranged to respectively face the first and third pixels 110a and 110c. The first color separation elements 131 may be configured to allow light C2 having a second wavelength band of incident light to travel in a downward direction with respect to the first color separation elements 131 and allow light C1+C3 which is a mixture of lights having a first wavelength band and a third wavelength band of the incident light to travel at an inclined angle (or in a lateral direction) toward both sides of the first color separation elements 131. Thus, the light C2 having the second wavelength band separated by the first color separation elements 131 may travel toward the second pixel 110b below the first color separation element 131, and the light C1+C3 which is the mixture of the lights having the first and third wavelength bands may travel toward the first pixels 110a at both sides of the second pixel 110b.

The second color separation elements 132 may be configured to allow the light C2 having the second wavelength band of the incident light to travel at an inclined angle toward both sides of the second color separation elements 132 and allow the light C1+C3 which is the mixture of the lights having the first and third wavelength bands to travel in a downward direction with respect to the second color separation elements 132. Thus, the light C1+C3 which is the mixture of the lights having the first and third wavelength bands and separated by the second color separation element 132 may travel toward the first and third pixels 110a and 110c below the second color separation element 132 and the light C2 having the second wavelength band may travel toward the second pixels 110b at both sides of the first and third pixels 110a and 110c.

The image sensor of FIG. 10 may include a first color filter 121 located on the first pixel 110a to transmit only the light C1 having the first wavelength band, similar to the image sensor described above with reference to FIGS. 1 and 6. A second color filter that transmits only the light C2 having the second wavelength band may be selectively located on the second pixels 110b. That is, the second color filter that transmits only the light C2 having the second wavelength band may be located on the second pixels 110b, or the second color filter may not be located on the second pixels 110b as shown in the embodiment of FIG. 10.

A color filter is not located on the third pixel 110c. Thus, only the light C1 having the first wavelength band may be sensed in the first pixel 110a, and only the light C2 having the second wavelength band may be sensed in the second pixels 110b. On the other hand, the light C1+C3 which is the mixture of the lights having the first and third wavelength bands may be sensed in the third pixel 110c. For example, the light C1 having the first wavelength band may be red light, the light C2 of the second wavelength band may be green light, and the light C3 having the third wavelength band may be blue light. The light C1+C3 which is the mixture of the lights having the first and third wavelength bands may be magenta light. Alternatively, the light C1 having the first wavelength band may be blue light, the light C2 of the second wavelength band may be green light, and the light C3 having the third wavelength band may be red light.

As illustrated in FIG. 10, the efficiency of using light may be further improved since the first and second color separation elements 131 and 132 are used.

Figure 11:
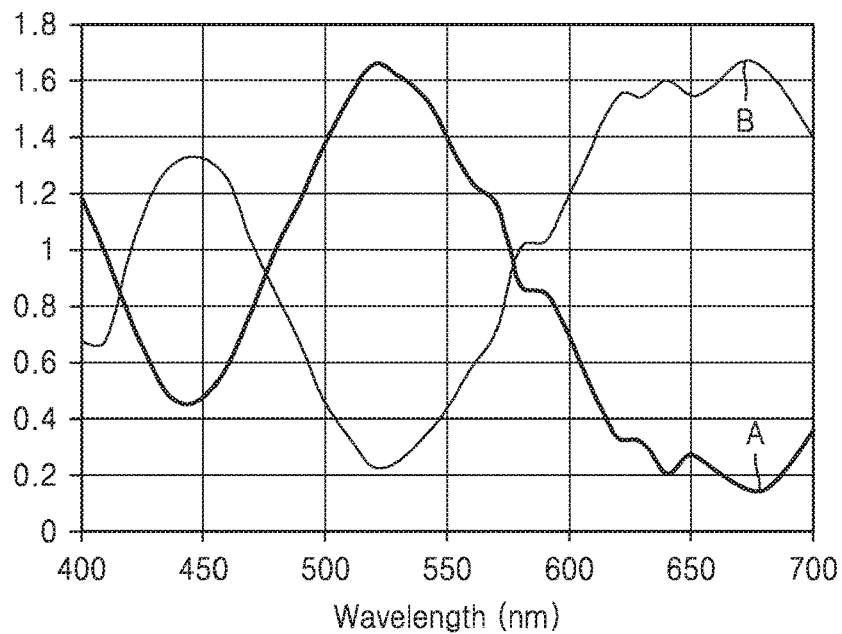
FIG. 11 is a graph showing a distribution of a spectrum of light separated by two color separation elements of FIG. 10.

FIG. 11 is a graph showing a distribution of the spectrum of light separated by the first and second color separation elements 131 and 132 of FIG. 10.

In FIG. 11, a graph denoted by 'A' shows the spectrum of light C2 having a second wavelength band traveling toward the second pixels 110b, and a graph denoted by 'B' shows the spectrum of light C1+C3 which is a mixture of lights having a first wavelength band and a third wavelength band and travels toward the first and third pixels 110a and 110c. Since light separated by the first color separation elements 131 and light separated by the second color separation elements 132 are combined together, the intensities of the lights shown in the graph of FIG. 10 are higher than those of the lights shown in the graphs of FIGS. 4 and 9.

Although FIGS. 1, 6, and 10 illustrate only a 2×2 pattern of one unit for convenience of explanation, an image sensor may include a pixel array including a plurality of 2×2 patterns that are two-dimensionally arranged.

Figure 12:
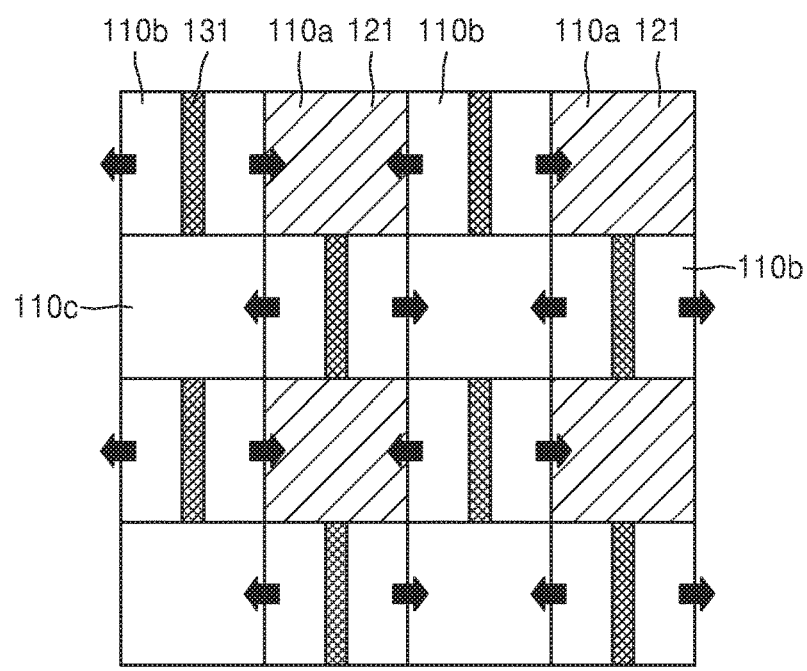
FIGS. 12 to 25 are schematic plan views of a structure of pixels of image sensors according to other various exemplary embodiments.

FIG. 12 illustrates an example of an arrangement of four 2×2 patterns.

Each of the four 2×2 patterns of FIG. 12 is substantially the same as the 2×2 pattern of FIG. 1. As illustrated in FIG. 12, a first color filter 121 may be arranged only on first pixels 110a and no color filter may be arranged on the other pixels. Also, a first color separation element 131 may be arranged only on second pixels 110b. Although it is described above that only the first color filter 121 is arranged on the first pixels 110a, exemplary embodiments are not limited thereto.

Figure 13:
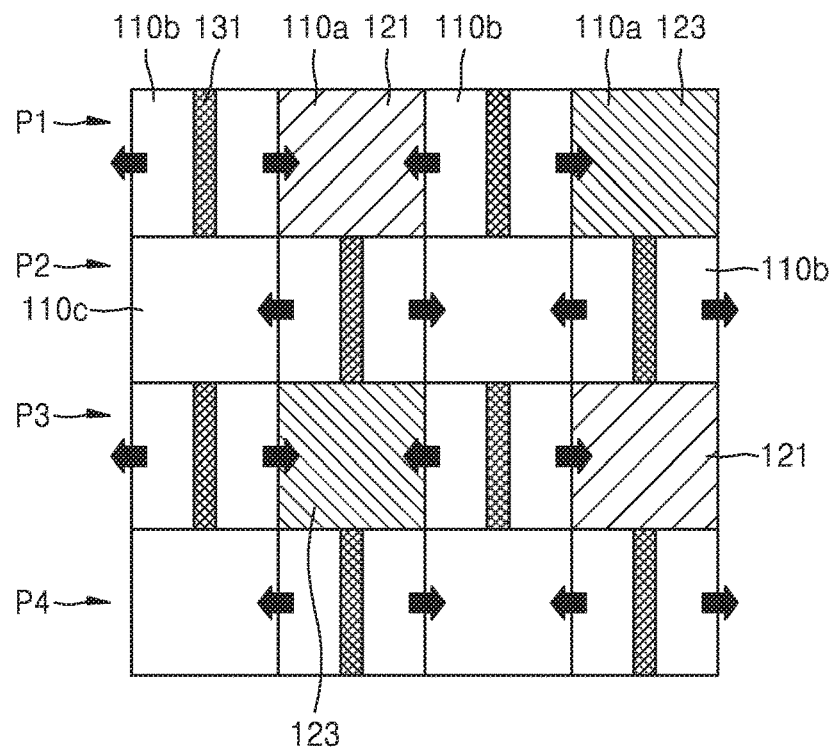

FIG. 13 is a schematic plan view of a structure of pixels of an image sensor according to still another exemplary embodiment.

Although it is described above that only the first color filter 121 is arranged on the first pixels 110a, exemplary embodiments are not limited thereto. Referring to FIG. 13, for example, a third color filter 123 that transmits only light C3 having a third wavelength band may be also arranged on some of first pixels 110a. That is, the first color filter 121 and the third color filter 123 may be alternately arranged on the first pixels 110a.

For example, the first color filter 121 and the third color filter 123 may be alternately arranged on the first pixels 110a in a first pixel row P1 in the order of the first color filter 121 and the third color filter 123. Also, the first color filter 121 and the third color filter 123 may be alternately arranged on the first pixels 110a in a third pixel row P3 in the order of the third color filter 123 and the first color filter 121. In this case, a plurality of first color filters 121 are arranged in one diagonal direction and a plurality of third color filters 123 are arranged in another diagonal direction. However, no color filter is arranged on third pixels 110c in a second pixel row P2 and a fourth pixel row P4.

In the exemplary embodiment of FIG. 13, light having a first wavelength band may be sensed in the first pixels 110a on which the first color filter 121 is arranged, and light having a third wavelength band may be sensed in the first pixels 110a on which the third color filter 123 is arranged. Also, light having a second wavelength band may be sensed in the second pixels 110b and light which is a mixture of the lights having the first and third wavelength bands may be sensed in the third pixels 110c.

An image signal processor (not shown) of the image sensor may calculate the amounts of the lights having the first to third wavelength bands, based on light C1 having the first wavelength band which penetrates the first color filter 121 and is then incident on the first pixels 110a, light C3 having the third wavelength band which penetrates the third color filter 123 and is then incident on the first pixels 110a, light C2 having the second wavelength band which is incident on the second pixels 110b, and light C1+C3 which is a mixture of the lights having the first and third wavelength bands and is incident on the third pixels 110c. For example, when the light C1 having the first wavelength band is red light, the light C2 having the second wavelength band is green light, and the light C3 having the third wavelength band is blue light, the image signal processor of the image sensor may precisely calculate red, green, and blue light components of incident light, based on the amount of the red light sensed in a first portion of the first pixels 110a, the amount of the blue light sensed in a second portion of the first pixels 110a, the amount of the green light sensed in the second pixels 110b, and the amount of magenta light sensed in the third pixels 110c.

Also, the intensity of red light incident on regions between the plurality of first color filters 121, e.g., the second and third pixels 110b and 110c arranged in the second and fourth pixel rows P2 and P4, may be calculated according to an interpolation method, based on the amount of red light sensed in the first portion of the first pixels 110a. Similarly, the intensity of blue light incident on regions between the plurality of third color filters 123, e.g., the second and third pixels 110b and 110c arranged in the second and fourth pixel rows P2 and P4, may be calculated according to the interpolation method, based on the amount of blue light sensed in the second portion of the first pixels 110a.

Figure 14:
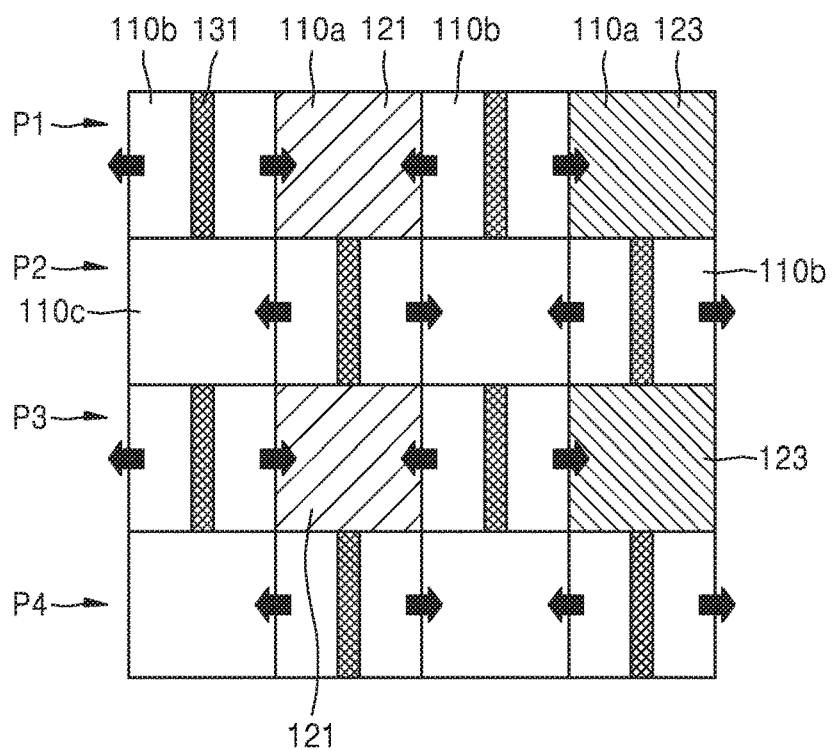

FIG. 14 is a schematic plan view of a structure of pixels of an image sensor according to still another exemplary embodiment.

The image sensor of FIG. 14 is substantially the same as the image sensor of FIG. 13, except for the arrangement of first color filters 121 and third color filters 123. Referring to FIG. 14, the first color filters 121 and the third color filters 123 may be sequentially and alternately arranged on first pixels 110a in first and third pixel rows P1 and P3. In this case, the same color filters are arranged in the same pixel column. For example, the first and third color filters 121 and 123 may be respectively arranged in a vertical direction (or column direction).

Figure 15:
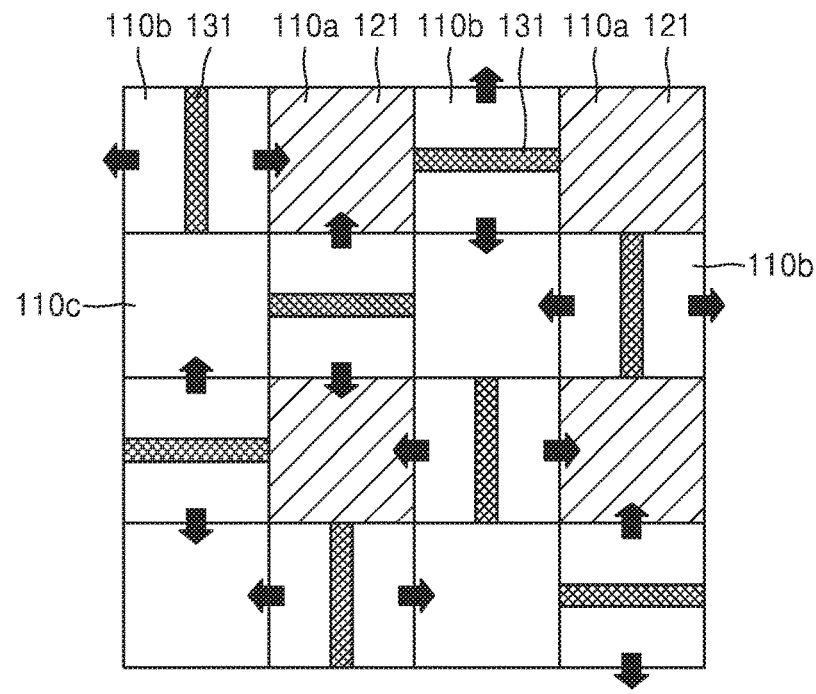

FIG. 15 is a schematic plan view of a structure of pixels of an image sensor according to still another exemplary embodiment.

The image sensor of FIG. 15 is substantially the same as the image sensor of FIG. 12, except for the arrangement of first color separation elements 131. Referring to FIG. 15, two adjacent first color separation elements 131 may be positioned with respect to each other at an angle of 90 degrees. For example, first color separation elements 131 arranged in a vertical direction and first color separation elements 131 arranged in a horizontal direction may be alternately arranged in a first pixel row P1. Also, first color separation elements 131 arranged in the horizontal direction and first color separation elements 131 arranged in the vertical direction may be alternately arranged in a second pixel row P2.

In this case, the first color separation elements 131 arranged in the vertical direction in the first pixel row P1 may provide light C1+C3, which is a mixture of lights having first and third wavelength bands, to first pixels 110a arranged in the first pixel row P1. The first color separation elements 131 arranged in the horizontal direction in the first pixel row P1 may provide the light C1+C3, which is the mixture of the lights having the first and third wavelength bands, to third pixels 110c arranged in another pixel row (e.g., the second pixel row P2). The first color separation elements 131 arranged in the vertical direction in the second pixel row P2 may provide the light C1+C3, which is the mixture of the lights having the first and third wavelength bands, to the third pixels 110c arranged in the second pixel row P2. The first color separation elements 131 arranged in the horizontal direction in the second pixel row P2 may provide the light C1+C3, which is the mixture of the lights having the first and third wavelength bands, to first pixels 110a arranged in another pixel row (e.g., the first pixel row P1 or a third pixel row P3).

Figure 16:
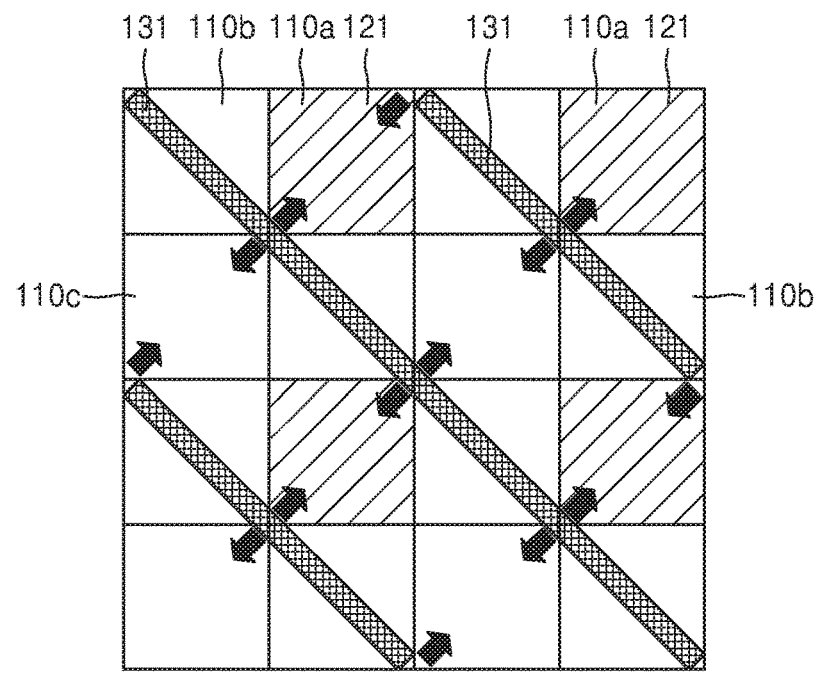

FIG. 16 is a schematic plan view of a structure of pixels of an image sensor according to still another exemplary embodiment.

The image sensor of FIG. 16 is substantially the same as the image sensor of FIG. 12, except for the arrangement of first color separation elements 131. Referring to FIG. 16, the first color separation elements 131 may extend (or may be oriented) in a first diagonal direction (e.g., from a top left to a bottom right) of the pixel array. Thus, the first color separation elements 131 may be arranged to cross a plurality of second pixels 110b in the first diagonal direction. In this case, the first color separation elements 131 may provide light C1+C3 which is a mixture having lights of first and third wavelength bands to first pixels 110a and third pixels 110c. Although FIG. 16 illustrates that the first color separation elements 131 extend in the first diagonal direction, the first color separation elements 131 may extend in a second diagonal direction (e.g., from a top right to a bottom left) intersecting the first diagonal direction.

Figure 17:
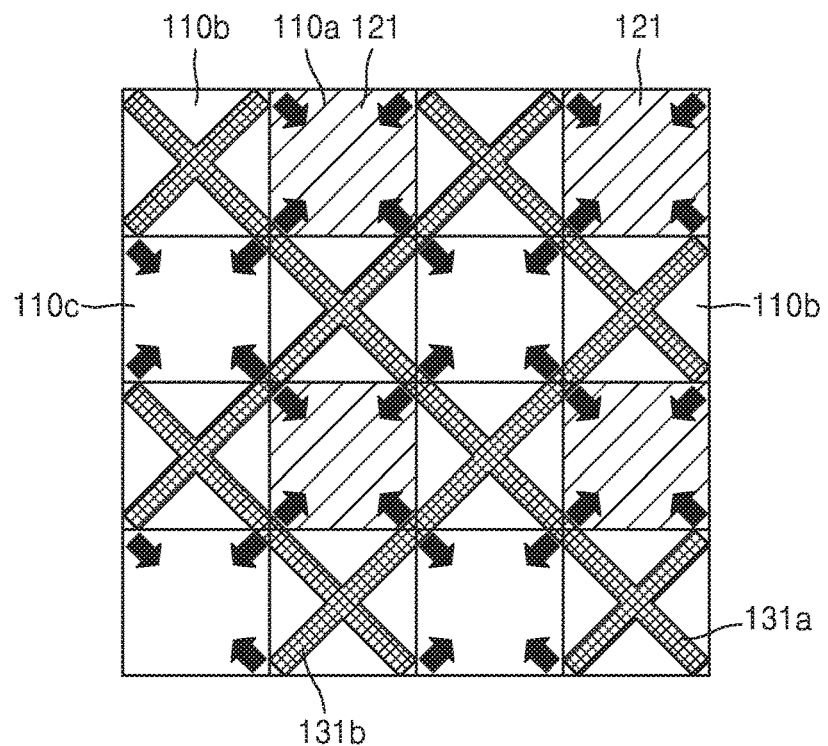

FIG. 17 is a schematic plan view of a structure of pixels of an image sensor according to still another exemplary embodiment.

In the image sensor of FIG. 17, first color separation elements 131 may extend in both a first diagonal direction and a second diagonal direction. For example, each of the first color separation elements 131 may include a first sub-color separation element 131a that extends in the first diagonal direction (e.g., from a top left to bottom right) and a second sub-color separation element 131b that extends in the second diagonal direction (e.g., from a top right to a bottom left).

Figure 18:
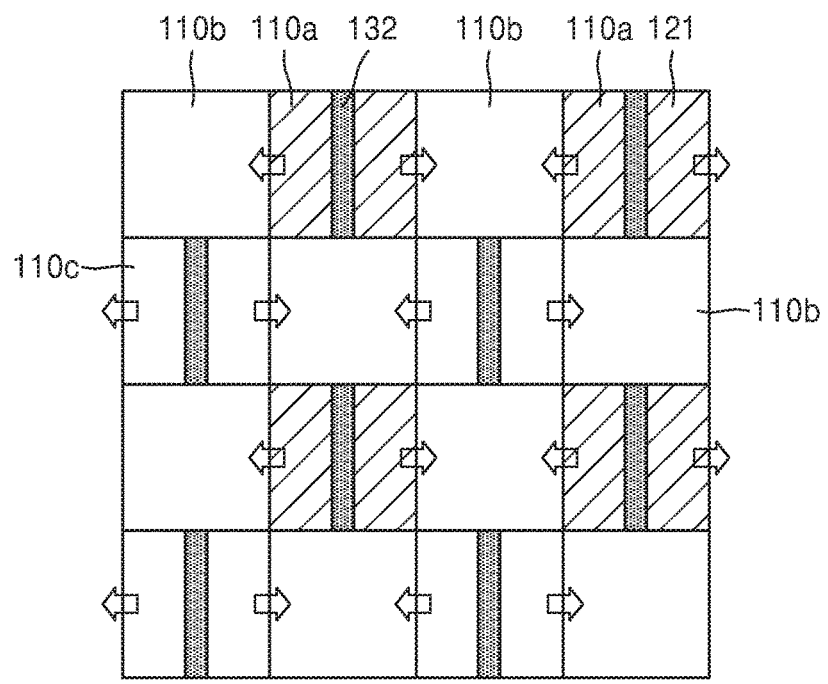

FIG. 18 illustrates an arrangement of four 2×2 patterns according to the embodiment of FIG. 6.

Each of the four 2×2 patterns illustrated in FIG. 18 is substantially the same as the 2×2 pattern according to the embodiment of FIG. 6. As illustrated in FIG. 18, a second color separation element 132 may be arranged on each of a plurality of first pixels 110a and a plurality of third pixels 110c. A first color filter 121 may be arranged only on each of the plurality of first pixels 110a and not arranged in the other pixels.

Figure 19:
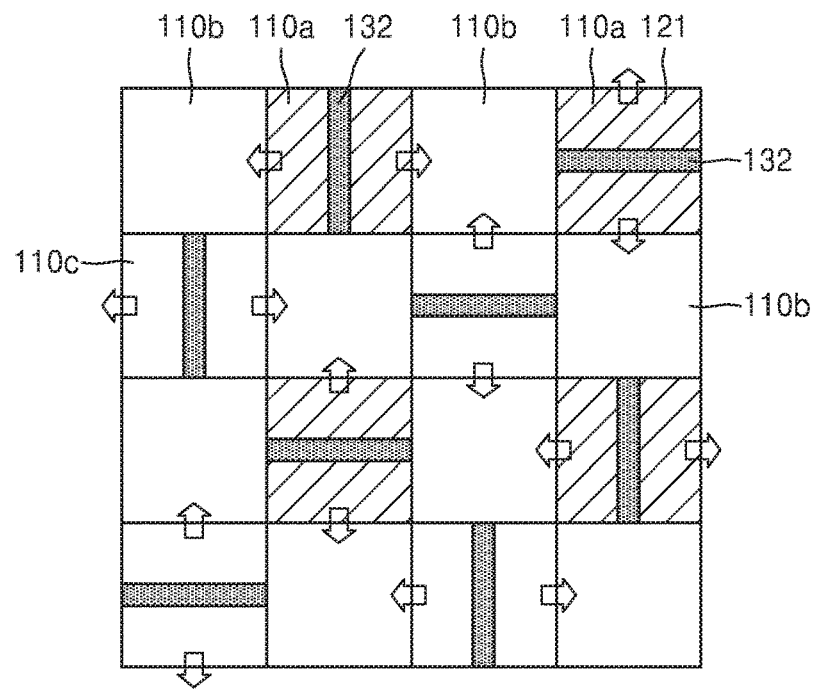

FIG. 19 is a schematic plan view of a structure of pixels of an image sensor according to still another exemplary embodiment.

The image sensor of FIG. 19 is substantially the same as the image sensor of FIG. 18, except for the arrangement of second color separation elements 132. Referring to FIG. 19, two adjacent second color separation elements 132 may be positioned with respect to each other at an angle of about 90 degrees. For example, second color separation elements 132 arranged in a vertical direction and second color separation elements 132 arranged in a horizontal direction may be alternately arranged in a first pixel row P1. Also, second color separation elements 132 arranged in the horizontal direction and second color separation elements 132 arranged in the vertical direction may be alternately arranged in a second pixel row P2. In this case, the second color separation elements 132 arranged in the vertical direction may provide light C2 having a second wavelength band to second pixels 110b arranged in the pixel rows in which the second color separation elements 132 are arranged. The second color separation elements 132 arranged in the horizontal direction may provide the light C2 of the second wavelength band to the second pixels 110b arranged in pixel rows in which the second color separation elements 132 are not arranged.

Figure 20:
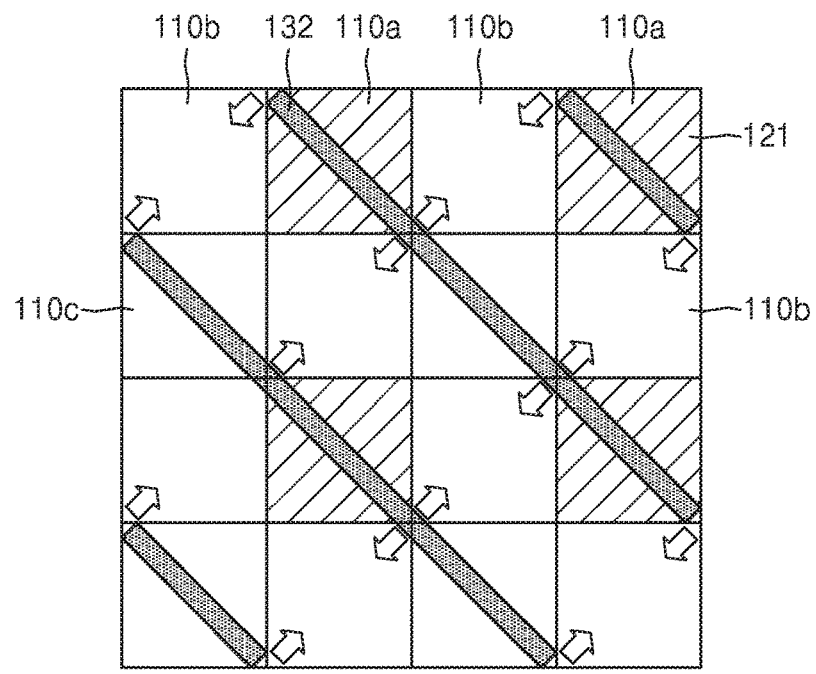

FIG. 20 is a schematic plan view of a structure of pixels of an image sensor according to still another exemplary embodiment.

The image sensor of FIG. 20 is substantially the same as the image sensor of FIG. 18, except for the arrangement of second color separation elements 132. Referring to FIG. 20, the second color separation elements 132 may extend in a first diagonal direction. Thus, the second color separation elements 132 may be arranged to cross a plurality of first pixels 110a and a plurality of third pixels 110c in the first diagonal direction. Although FIG. 20 illustrates that the second color separation elements 132 extend in the first diagonal direction, the second color separation elements 132 may extend in a second diagonal direction intersecting the first diagonal direction.

Figure 21:
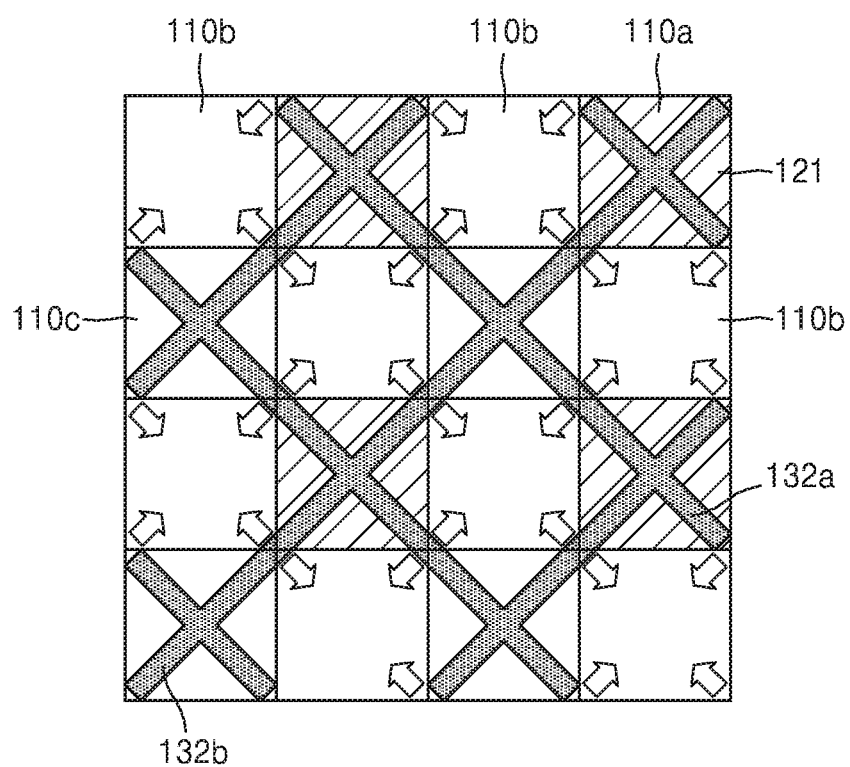

FIG. 21 is a schematic plan view of a structure of pixels of an image sensor according to still another exemplary embodiment.

In the image sensor of FIG. 21, second color separation elements 132 may extend in both a first diagonal direction and a second diagonal direction. For example, each of the second color separation elements 132 may include a first sub-color separation element 132a that extends in the first diagonal direction and a second sub-color separation element 132b that extends in the second diagonal direction.

Figure 22:
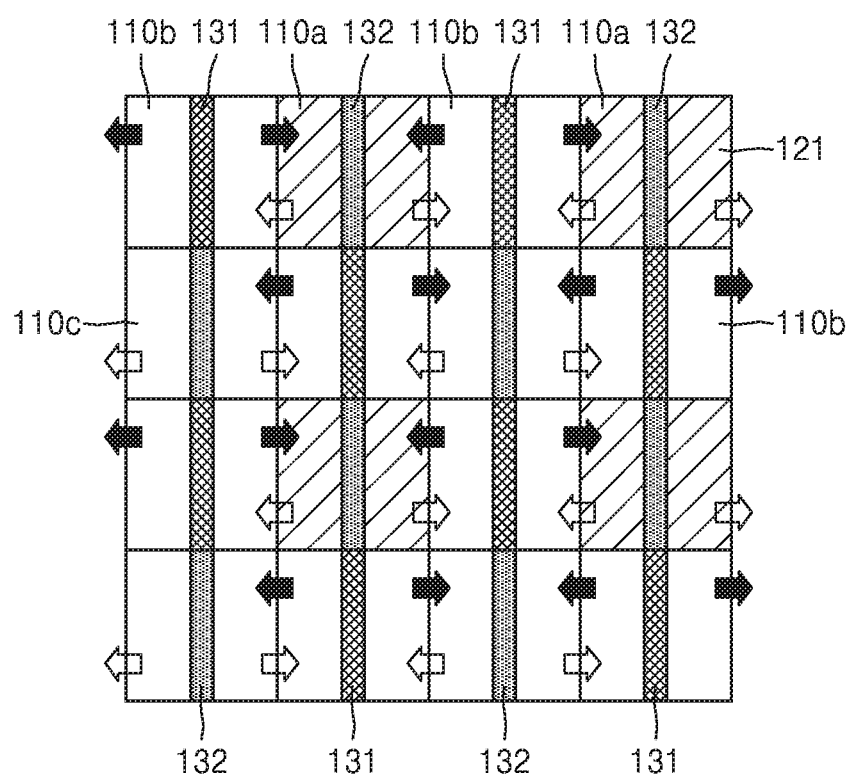

FIG. 22 illustrates an arrangement of four 2×2 patterns according to the embodiment of FIG. 10.

Each of the 2×2 patterns illustrated in FIG. 22 is substantially the same as the 2×2 pattern according to the embodiment of FIG. 10. As illustrated in FIG. 22, first color separation elements 131 may be respectively arranged on a plurality of second pixels 110b, and one of second color separation elements 132 may be arranged on each of a plurality of first pixels 110a and a plurality of third pixels 110c. Also, a first color filter 121 may be arranged on only each of the plurality of first pixels 110a and not arranged on the other pixels.

Figure 23:
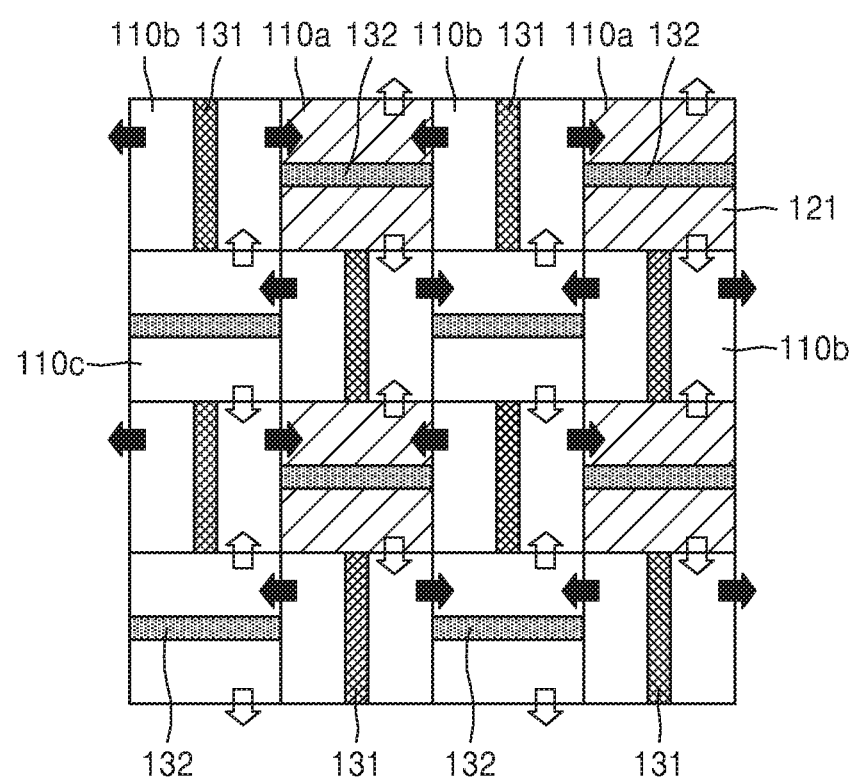

FIG. 23 is a schematic plan view of a structure of pixels of an image sensor according to still another exemplary embodiment.

The image sensor of FIG. 23 is substantially the same as the image sensor of FIG. 22, except for the arrangement of first and second color separation elements 131 and 132. Referring to FIG. 23, first and second color separation elements 131 and 132 located adjacent to each other may be positioned with respect to each other at an angle of about 90 degrees. For example, first color separation elements 131 arranged in a vertical direction and second color separation elements 132 arranged in a horizontal direction may be alternately arranged in a first pixel row P1. Also, second color separation elements 132 arranged in the horizontal direction and first color separation elements 131 arranged in the vertical direction may be alternately arranged in a second pixel row P2.

Figure 24:
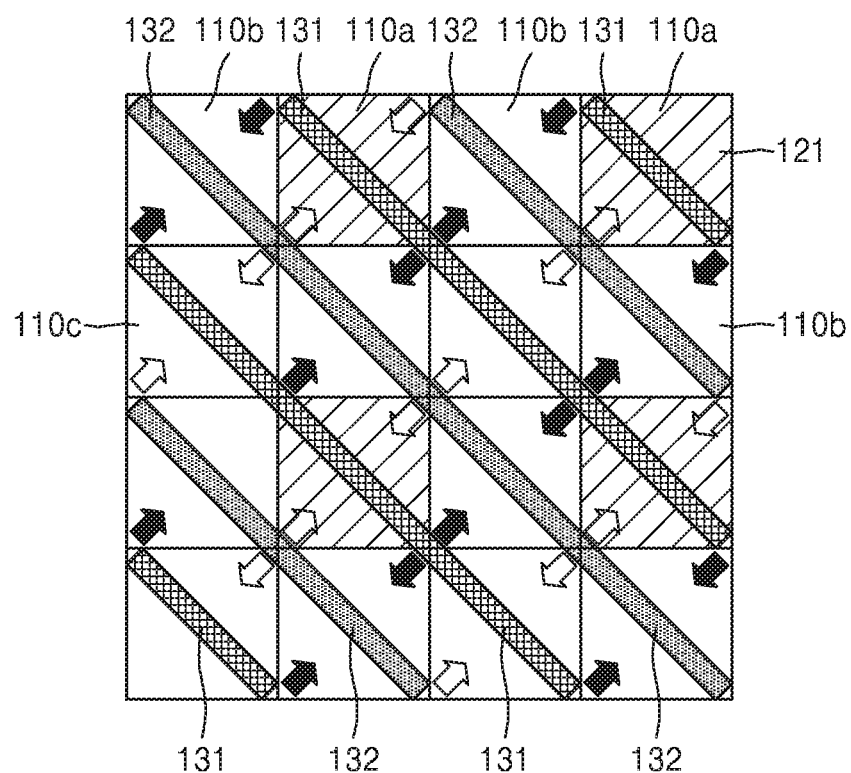

FIG. 24 is a schematic plan view of a structure of pixels of an image sensor according to still another exemplary embodiment.

The image sensor of FIG. 24 is substantially the same as the image sensor of FIG. 22, except for the arrangement of first and second color separation elements 131 and 132. Referring to FIG. 24, the first and second color separation elements 131 and 132 may extend in a first diagonal direction. Thus, the first color separation elements 131 may be arranged to cross a plurality of second pixels 110b in the first diagonal direction. Also, the second color separation elements 132 may be arranged to cross a plurality of first pixels 110a and a plurality of third pixel 110c in the first diagonal direction. Although FIG. 24 illustrates that the first and second color separation elements 131 and 132 extend in the first diagonal direction, the first and second color separation elements 131 and 132 may extend in a second diagonal direction crossing (or intersecting) the first diagonal direction.

Figure 25:
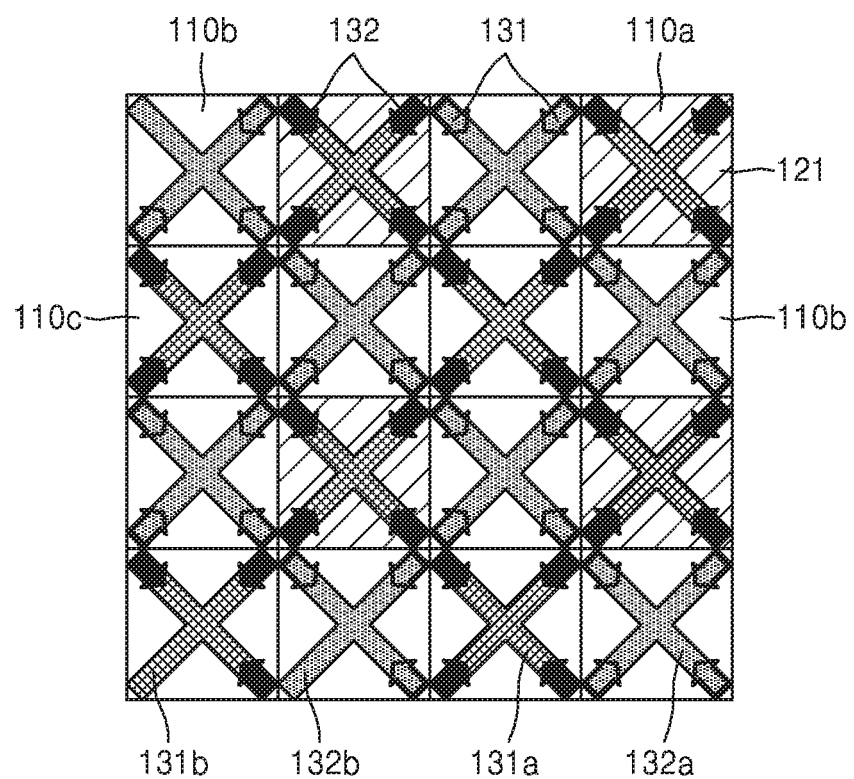

FIG. 25 is a schematic plan view of a structure of pixels of an image sensor according to another exemplary embodiment.

In the image sensor of FIG. 25, first and second color separation elements 131 and 132 may extend in both a first diagonal direction and a second diagonal direction. For example, each of the first color separation elements 131 may include a first sub-color separation element 131a that extends in the first diagonal direction and a second sub-color separation element 131b that extends in the second diagonal direction. Similarly, each of the second color separation elements 132 may include a first sub-color separation element 132a that extends in the first diagonal direction and a second sub-color separation element 132b that extends in the second diagonal direction.

FIGS. 15 to 25 illustrate that only the first color filters 121 are arranged on the first pixels 110a. However, as illustrated in FIG. 13 or 14, a third color filter 123 that transmits only light C3 having a third wavelength band may be arranged on some of the first pixels 110a in the exemplary embodiments of FIGS. 15 to 25. For example, in the exemplary embodiments of FIGS. 15 to 25, first color filters 121 and third color filters 123 may be respectively and alternately arranged on the first pixels 110a.

Also, according to an exemplary embodiment, the third color filters 123 may replace the first color filters 121, and only the third color filters 123 may be arranged on the first pixels 110a. In this case, an image signal processor of the image sensor may calculate the amounts of the light having the first to third wavelength bands, based on light C3 having the third wavelength band which penetrates the third color filter 123 and is then incident on the first pixels 110a, light C2 having the second wavelength band which is incident on the second pixels 110b, and light C1+C3 which is a mixture of the lights having the first and third wavelength bands and is incident on the third pixels 110c. For example, when the light C1 having the first wavelength band is red light, the light C2 having the second wavelength band is green light, and the light C3 having the third wavelength band is blue light, the image signal processor of the image sensor may precisely calculate red, green, and blue light components of incident light, based on the amount of the blue light sensed in the first pixels 110a, the amount of the green light sensed in the second pixels 110b, and the amount of magenta light sensed in the third pixels 110c.

Although a few embodiments have been shown and described, it would be appreciated by those skilled in the art that changes may be made in example embodiments without departing from the principles and spirit of the disclosure, the scope of which is defined in the claims and their equivalents.

What is claimed is:

1. An image sensor comprising:
   a pixel array comprising a first pixel row, in which a plurality of first pixels and a plurality of second pixels are alternately arranged, and a second pixel row, in which a plurality of second pixels and a plurality of third pixels are alternately arranged;
   first color separation elements arranged to face the plurality of second pixels arranged in the first pixel row and the plurality of second pixels arranged in the second pixel row, the first color separation elements being configured to allow light having a second wavelength band, among incident light, to pass therethrough and travel in a downward direction, and to allow a mixture of light having a first wavelength band and light having a third wavelength band, among the incident light, to pass therethrough and travel in a lateral direction; and
   first color filters on at least a portion of the plurality of first pixels, the first color filters being configured to transmit only the light having the first wavelength band.

2. The image sensor of claim 1, wherein the light having the second wavelength passes through the first color separation elements and is incident on the plurality of second pixels arranged in the first pixel row and the plurality of second pixels arranged in the second pixel row,
   wherein, in the first pixel row, the mixture of the light having the first wavelength band and the light having the third wavelength band passes through the first color separation elements and is incident on the first color filters, and
   wherein, in the second pixel row, the mixture of the light having the first wavelength band and the light having the third wavelength band passes through the first color separation elements and is incident on the plurality of third pixels.

3. The image sensor of claim 2, wherein the image sensor is configured to obtain an intensity of at least one of the light having the first wavelength band, the light having the second wavelength band, and the light having the third wavelength band, based on the light having the first wavelength band and which is incident on the plurality of first pixels, the light having the second wavelength band and which is incident on the plurality of the second pixels arranged in the first pixel row and the plurality of second pixels arranged in the second pixel row, and the mixture of the light having the first wavelength band and the light having the third wavelength band, which is incident on the plurality of third pixels.

4. The image sensor of claim 1, further comprising a second color filter on a second pixel, the second color filter being configured to transmit only the light having the second wavelength band.

5. The image sensor of claim 1, further comprising third color filters on a first portion of the plurality of first pixels, third color filters being configured to transmit only the light having the third wavelength band,
   wherein the first color filters are arranged on a second portion of the plurality of first pixels, and
   wherein the first color filters and the third color filters are alternately arranged on the plurality of first pixels.

6. The image sensor of claim 5, wherein the image sensor is configured to obtain an intensity of at least one of the light having the first wavelength band, the light having the second wavelength band, and the light having the third wavelength band, based on the light having the first wavelength band which passes the first color filters and is incident on the second portion of the plurality of first pixels, the light having the third wavelength band which passes the third color filters and is incident on the first portion of the plurality of the first pixels, the light having the second wavelength band which is incident on the plurality of the second pixels arranged in the first pixel row and the plurality of second pixels arranged in the second pixel row, and the mixture of the light having the first wavelength band and the light having the third wavelength band, which is incident on the plurality of third pixels.

7. The image sensor of claim 1, wherein adjacent first color separation elements are positioned to have an angle of about 90 degrees with respect to each other.

8. The image sensor of claim 1, wherein the plurality of second pixels arranged in the first pixel row and the plurality of second pixels arranged in the second pixel row are arranged in a first diagonal direction, and
   wherein the plurality of first pixels in the first pixel row and the plurality of third pixels in the second pixel row are arranged in a second diagonal direction crossing the first diagonal direction.

9. The image sensor of claim 8, wherein the first color separation elements extend in at least one of the first diagonal direction and the second diagonal direction.

10. The image sensor of claim 8, wherein a first separation element among the first color separation elements comprises:
    a first sub-color separation element that extends in the first diagonal direction; and
    a second sub-color separation element that extends in the second diagonal direction.

11. The image sensor of claim 1, further comprising second color separation elements arranged to respectively face the plurality of first pixels and the plurality of third pixels and configured to allow the light having the second wavelength band, among the incident light, to pass therethrough and travel in the lateral direction, and configured to allow the mixture of the light having the first wavelength band and the light having the third wavelength band to pass therethrough and travel in the downward direction.

12. The image sensor of claim 11, wherein adjacent first and second color separation elements are positioned to have an angle of about 90 degrees with respect to each other.

13. The image sensor of claim 11, wherein the plurality of second pixels arranged in the first pixel row and the plurality of second pixels arranged in the second pixel row are arranged in a first diagonal direction,
wherein the plurality of first pixels in the first pixel row and the plurality of third pixels in the second pixel row are arranged in a second diagonal direction crossing the first diagonal direction, and
wherein the first and second color separation elements respectively extend in at least one of the first diagonal direction and the second diagonal direction.

14. The image sensor of claim 11, wherein the plurality of second pixels arranged in the first pixel row and the plurality of second pixels arranged in the second pixel row are arranged in a first diagonal direction,
wherein the plurality of first pixels and the plurality of third pixels are arranged in a second diagonal direction crossing the first diagonal direction, and
wherein a first color separation element and a second color separation element respectively comprise:
a first sub-color separation element that extends in the first diagonal direction; and
a second sub-color separation element that extends in the second diagonal direction.

15. The image sensor of claim 1, further comprising a transparent dielectric layer on the pixel array,
wherein the first color separation elements are positioned in the transparent dielectric layer, and
wherein the first color filter is between the pixel array and the transparent dielectric layer.

16. An image sensor comprising:
a pixel array comprising a first pixel row, in which a plurality of first pixels and a plurality of second pixels are alternately arranged, and a second pixel row, in which a plurality of second pixels and a plurality of third pixels are alternately arranged;
color separation elements arranged to respectively face the plurality of first pixels and the plurality of third pixels, the color separation elements being configured to allow light having a second wavelength band, among incident light, to pass therethrough and travel in a lateral direction, and to allow a mixture of light having a first wavelength band and light having a third wavelength band, among the incident light, to pass therethrough and travel in a downward direction; and
first color filters on at least a portion of the plurality of first pixels, the first color filters being configured to transmit only the light having the first wavelength band.

17. The image sensor of claim 16, wherein the light having the second wavelength band passes through the color separation elements and is incident on the plurality of second pixels arranged in the first pixel row and the plurality of second pixels arranged in the second pixel row,
wherein, in the first pixel row, the mixture of the light having the first wavelength band and the light having the third wavelength band passes through the color separation elements and is incident on the first color filters, and
wherein, in the second pixel row, the mixture of the light having the first wavelength band and the light having the third wavelength band passes through the color separation elements and is incident on the plurality of third pixels.

18. The image sensor of claim 17, wherein the image sensor is configured to obtain an intensity of at least one of the light having the first wavelength band, the light having the second wavelength band, and the light having the third wavelength band, based on the light having the first wavelength band and which is incident on the plurality of first pixels, the light having the second wavelength band and which is incident on the plurality of second pixels arranged in the first pixel row and the plurality of second pixels arranged in the second pixel row, and the mixture of the light having the first wavelength band and the light having the third wavelength band, which is incident on the plurality of third pixels.

19. The image sensor of claim 16, further comprising third color filters on a first portion of the plurality of first pixels, the third color filters configured to transmit only the light having the third wavelength band,
wherein the first color filters are arranged on a second portion of the plurality of first pixels, and
wherein the first color filters and the third color filters are alternately disposed on the plurality of first pixels.

20. The image sensor of claim 16, wherein a color separation element is positioned to have an angle of about 90 degrees with respect to another color separation element.

21. The image sensor of claim 16, wherein the plurality of second pixels arranged in the first pixel row and the plurality of second pixels arranged in the second pixel row are arranged in a first diagonal direction, and
wherein the plurality of first pixels in the first pixel row and the plurality of third pixels in the second pixel row are arranged in a second diagonal direction crossing the first diagonal direction.

22. The image sensor of claim 21, wherein the color separation elements extend in at least one of the first diagonal direction and the second diagonal direction.

23. The image sensor of claim 21, wherein a color separation element among the color separation elements comprises:
a first sub-color separation element that extends in the first diagonal direction; and
a second sub-color separation element that extends in the second diagonal direction.

24. The image sensor of claim 16, further comprising a transparent dielectric layer located on the pixel array,
wherein the color separation elements are positioned in the transparent dielectric layer, and
wherein the first color filter is between the pixel array and the transparent dielectric layer.

* * * * *